(12) United States Patent
Harada

(10) Patent No.: US 6,339,213 B2
(45) Date of Patent: *Jan. 15, 2002

(54) SOLID STATE IMAGING DEVICE AND METHOD FOR DRIVING THE SAME

(75) Inventor: Kouichi Harada, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/123,997

(22) Filed: Jul. 29, 1998

(30) Foreign Application Priority Data

Jul. 30, 1997 (JP) .............................................. 9-204676

(51) Int. Cl.$^7$ ............................................... H01L 27/00
(52) U.S. Cl. ..................... 250/208.1; 348/302; 348/303; 257/232
(58) Field of Search ........................ 250/208.1; 348/302, 348/303, 304, 305, 311, 314, 317, 319, 320, 322; 257/232, 233

(56) References Cited

U.S. PATENT DOCUMENTS 5,289,022 A * 2/1994 Iizuka et al. ................. 348/311

* cited by examiner

Primary Examiner—John R. Lee
Assistant Examiner—Kevin Pyo
(74) Attorney, Agent, or Firm—Sonnenschein, Nath & Rosenthal

(57) ABSTRACT

A CCD solid state imaging device (21), which is comprised of an imaging section (24) formed of a plurality of light receiving portions (22), each serving as a pixel, and of a vertical transfer register (23) corresponding to each column of light receiving portions, first and second storage sections (26A) and (26B) capable of storing a charge from the imaging section (24), a horizontal transfer register (27) and a smear drain region (28), is employed, wherein after a first smear component charge (I) in the vertical transfer register (23) is swept away to the smear drain region , the vertical transfer register is operated at a high speed under such a state that a signal charge of the light receiving portion (22) is not read to the vertical transfer register (23) to store a second smear component charge (II) generated during the high speed transfer in the first storage section (26A), then the signal charge of the light receiving portion (22) is read to the vertical transfer register (23), the same is transferred at a high speed, an added charge of the second smear component charge (II) generated during the high speed transfer and the signal charge is stored in the first storage section (26A), and at the same time the second smear component charge (II) in the first storage section (26A) is transferred to the second storage section (26B) to be stored therein; and a difference between a signal of the second smear component charge (II) and a signal of the added charge is outputted in an outside.

16 Claims, 18 Drawing Sheets

SOLID STATE IMAGING DEVICE AND METHOD FOR DRIVING THE SAME

BACKGROUND OF THE INVENTION

1. Field of the Invention

The present invention relates to a solid state imaging device and a method for driving the same.

2. Description of the Related Art

As a CCD solid state imaging device, there has been known a CCD solid state imaging device of, for example, a frame interline transfer (FIT) system, a multiple-frame interline transfer (M-FIT) system and so on.

As shown in FIG. 1, a CCD solid state imaging device 1 of the frame interline transfer (FIT) system is formed of an imaging section 4 which comprises a plurality of light receiving portions 2, each serving as a pixel, arranged in a matrix fashion and vertical transfer registers 3 of a CCD structure each corresponding to each column of the light receiving portions 2, a storage section 6 comprising vertical transfer registers 5 of a similar CCD structure corresponding to the respective vertical transfer registers 3 in the imaging section 4, a horizontal transfer register 7 adjacent to the storage section 6, and an output section 8.

In the CCD solid state imaging device 1, a signal charge obtained by photoelectric-converting a light in the light receiving portion 2 is read to the vertical transfer register 3 and then once transferred at a high speed (so-called high speed frame shift) to the vertical transfer register 5 in the storage section 6. Thereafter, the signal charge at every one horizontal line is transferred from the storage section 6 to the horizontal transfer register 7, transferred within the horizontal transfer register 7 and outputted as a signal from the output section 8 sequentially.

In the CCD solid state imaging device 1 of the FIT system, since a period within which the signal charge resides in the vertical transfer register 3 in the imaging section 4 to which a light may be leaked can be shortened by the frame shift, a smear component charge can be reduced.

As shown in FIG. 2, a CCD solid state imaging device 11 of a multiple frame interline transfer (M-FIT) is formed of an imaging section 14 comprising a plurality of light receiving portions 12, each serving as a pixel, arranged in a matrix fashion and vertical transfer registers 13 of a CCD structure corresponding to columns of the light receiving portions 12, respectively, a storage section 16 having vertical transfer registers of the CCD structure made of transfer portions with a stage number twice as that of, for example, the vertical transfer registers 13 in the imaging section 14 in correspondence with the vertical transfer register 13, that is, a first storage section 16A having vertical transfer registers 15A made of transfer portions same as the vertical transfer registers 13 in half the stage number and a second storage section 16B contiguous to the first storage section 16A and having vertical transfer registers 15B made of transfer portions same as the former in half the stage number, a horizontal transfer register 17 contiguous to the second storage section 16B, and an output section 18.

In the CCD solid state imaging device 11, within the same vertical blanking period, a signal charge of the light receiving portion 12 on an odd line is transferred first, and then a signal charge of the light receiving portion 12 on an even line is transferred, whereby all the signal charges are transferred.

Specifically, as shown in FIG. 2, the signal charge of the light receiving portion 12 on the odd line is read to the vertical transfer register 13, and then transferred to the vertical transfer register 15A of the first storage section 16A at a high speed transfer (high speed frame shift). Next, the signal charge of the light receiving portion 12 on the even line is read to the vertical transfer register 13, and then transferred to the vertical transfer register 15A of the first storage section 16A at a high speed transfer (high speed frame shift) and at the same time, the signal charge of the odd line stored in the first storage section 16A is transferred to the vertical transfer register 15B in the second storage section 16B at a high speed transfer (high speed frame shift).

Thereafter, the signal charge on every one horizontal line is transferred from the storage section 16 (16A, 16B) to the horizontal transfer register 17, transferred within the horizontal transfer register 17 and sequentially outputted from the output section 18 as a signal.

Then, the signals of all the pixels, that is, the signal on the odd line and the signal on the even line, which are separated and outputted, are rearranged in the original order after they are output from the output section 18.

According to the CCD solid state imaging device 11 of the M-FIT system, the sensitivity is improved as well as the smear is reduced.

In the CCD solid state imaging device 1 of the FIT system, as described above, the residing period of the signal charge in the vertical transfer register 3 of the imaging section 4 is shortened by the frame shift and then the smear is reduced. However, the smear component charge is generated during the frame shift and hence it is desireable to further reduce the smear. The generation of the smear component charge during the frame shift is directly proportional to the number of pixels in the vertical direction. A large number of vertical pixels may be found in devices such as a high definition television (HDTV).

Recently, although the smear in the CCD solid state imaging device used in a HDTV camera is reduced much, if this smear reduction is compared with that of the CCD solid state imaging device used in a camera for the conventional broadcasting (NTSC), it is still deteriorated by about one digit.

In order that the CCD solid state imaging device is used in both the HDTV camera and one conventional broadcasting camera commonly, the smear is required to be reduced by about one digit as compared with the present smear value.

SUMMARY OF THE INVENTION

In view of the above point, an object of the present invention is to propose a CCD solid state imaging device and its driving method which can reduce smear.

Another object of the present invention is to propose a CCD solid state imaging device which can be applied, in addition to a low smear reading, to a field reading and to an all pixel reading (frame reading) by the M-FIT system and also can be used in a HDTV camera, a conventional broadcasting camera and a movie camera in common.

A CCD solid state imaging device according to the present invention comprises an imaging section formed of a plurality of light receiving portions and vertical transfer registers, first and second storage sections capable of storaging the charge from the imaging section, a horizontal transfer register, and a smear drain region, in which one bit amount of a transfer portion in the vertical transfer register corresponds to two adjacent light receiving portions and the vertical transfer register has a charge storage capacity capable of transferring handling charge amounts of two pixels.

According to the above CCD solid state imaging device, since there are provided the first and second storage sections, the two light receiving portions correspond to one bit amount of the transfer portion in the vertical transfer register of the imaging section, and the vertical transfer register is capable of transferring the handing charge amount of two pixels, a smear component in an interlace mode can be reduced considerably and a so-called low smear reading is made possible.

In other words, after a first smear component charge in the vertical transfer register, which is generated in a light receiving and storage period, is swept away at a high speed, without reading a signal, a signal charge is high-speed transferred (so-called high speed frame shift) first, and a second smear component charge generated during the high speed transfer is finally stored in the second storage section. Then, if the signal charge is read out and then transferred at a high speed (so-called high speed frame shift), and an added charge in which the signal charge and the second smear component charge generated during the high speed transfer are added, is stored in the first storage section, by obtaining a difference between the signal of the second smear component charge and the signal of added charge in the outside, it is possible to produce an image signal in which the smear component is reduced remarkably.

According to the CCD solid state imaging device with the above arrangement, since the vertical transfer register can transfer the handling charge amount of two pixels, it becomes possible that the signal charge in the light receiving portion is read to the vertical transfer register and the signal charges of two pixels are mixed in the vertical transfer register. Then, if the mixed signal charge of two pixels is transferred at a high speed to the second storage section passing through the first storage section, a normal field read-out can be carried out.

Furthermore, since the CCD solid state imaging device with the above arrangement comprises the first and second storage sections, the CCD solid state imaging device can be applied to a frame reading, i,e., a reading of all pixels of the M-FIT system.

A driving method of a CCD solid state imaging device according to the present invention uses a CCD solid state imaging device formed of an imaging section having a light receiving portion and a vertical transfer register, first and second storage sections, a horizontal transfer register and a smear drain region, and carries out such a process that after a first smear component charge in the vertical transfer register is swept away, a signal charge is transferred at a high speed without being read, a second smear component charge generated during the high speed transfer is stored in the first storage section, then the signal charge is read to the vertical transfer register and transferred at a high speed, an added charge in which the second smear component charge generated during the high speed transfer and the signal charge are added, is stored in the first storage section and at the same time, the second smear component charge in the first storage section is transferred to the second storage section and stored therein, and a difference between the signal of the second smear component charge and the signal of the added charge is outputted in the outside.

According to the above driving method, after the first smear component charge generated in the vertical transfer register during the light receiving and storage period is swept away, the signal charge is transferred at a high speed without being read, then the signal charge is read and transferred at a high speed, an added charge of the signal charge and the second smear component charge is stored in the first storage section, only the second smear component charge is stored in the second storage section, and the difference between the corresponding signals is outputted in the outside, whereby the second smear component generated during the high speed transfer period is canceled out and hence the smear component can be reduced remarkably.

The CCD solid state imaging device according to the present invention comprises an imaging section formed of a plurality of light receiving portions, each serving as a pixel, and vertical transfer registers corresponding to respective columns of light receiving portions, first and second storage sections capable of storaging the charge from the imaging section, a horizontal transfer register, and a smear drain region, in which one bit amount of a transfer portion in the vertical transfer register corresponds to two adjacent light receiving portions, and the vertical transfer register has a charge storage capacity capable of transferring handling charge amounts of two pixels.

According to the present invention, in the above CCD solid state imaging device, there are provided a means for transferring, at a high speed, the signal charge of the light receiving portion without being read to the vertical transfer register and finally storing the smear component charge generated during the high speed transfer in the second storage section, a means for reading the signal charge of the light receiving portion to the vertical transfer register, transferring the same at a high speed and storing an added charge of the smear component charge generated during the high speed transfer and the signal charge in the first storage section, and a means for outputting a difference between the signal of the smear component charge and the signal of the added charge at the outside.

According to the present invention, in the above CCD solid state imaging device, there are provided a means for reading the signal charge of the light receiving portion to the vertical transfer register, mixing signal charges of ones of adjacent two light receiving portions in the vertical transfer register, transferring the same at a high speed to the second storage section and outputting the same as a signal in an odd field, and a means for reading the signal charge of the light receiving portion to the vertical transfer register, mixing signal charges of the other ones of adjacent two light receiving portions in the vertical transfer register, transferring the same at a high speed to the second storage section and outputting the same as a signal in an even field.

A driving method of a CCD solid state imaging device according to the present invention uses a CCD solid state imaging device formed of an imaging section having a plurality of light receiving portions, each serving as a pixel, and a vertical transfer register corresponding to each column of the light receiving portions, first and second storage sections capable of storing a charge from the imaging section, a horizontal transfer register and a smear drain region, and carries out such a process that after a first smear component charge in the vertical transfer register is swept away, a signal charge is transferred at a high speed without being read to the vertical transfer register, a second smear component charge generated during the high speed transfer is stored in the first storage section, then the signal charge of the light receiving portion is read to the vertical transfer register and transferred at a high speed, an added charge, in which the second smear component charge generated during the high speed transfer and the signal charge are added, is stored in the first storage section and at the same time, the second smear component charge in the first storage section is transferred to the second storage section and stored

DESCRIPTION OF THE PREFERRED EMBODIMENTS

With reference to the attached drawing, the present invention will be described hereinafter.

Figure 1:
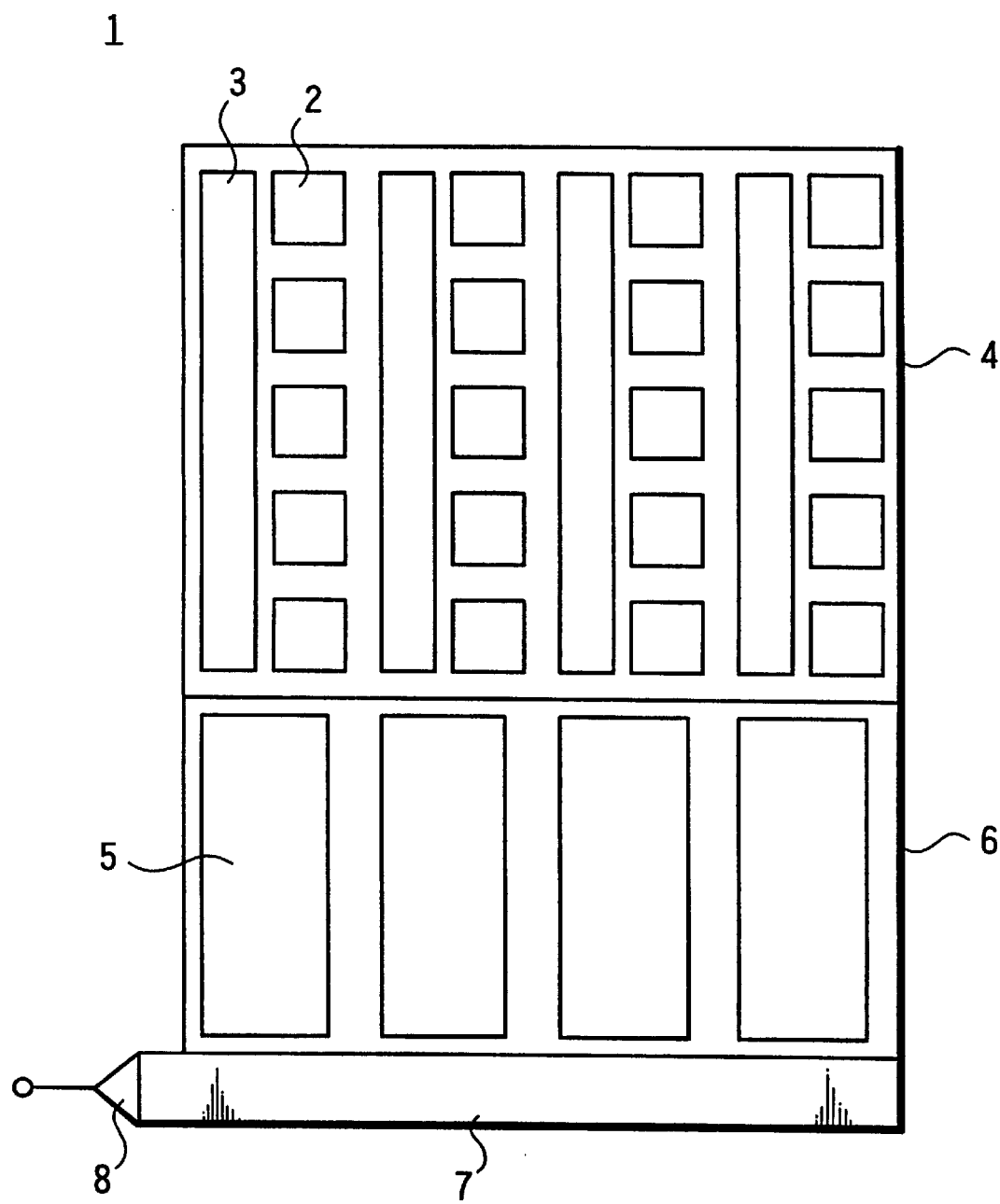
FIG. 1 is a diagram showing the arrangement of a known FIT type CCD solid state imaging device.
Figure 2:
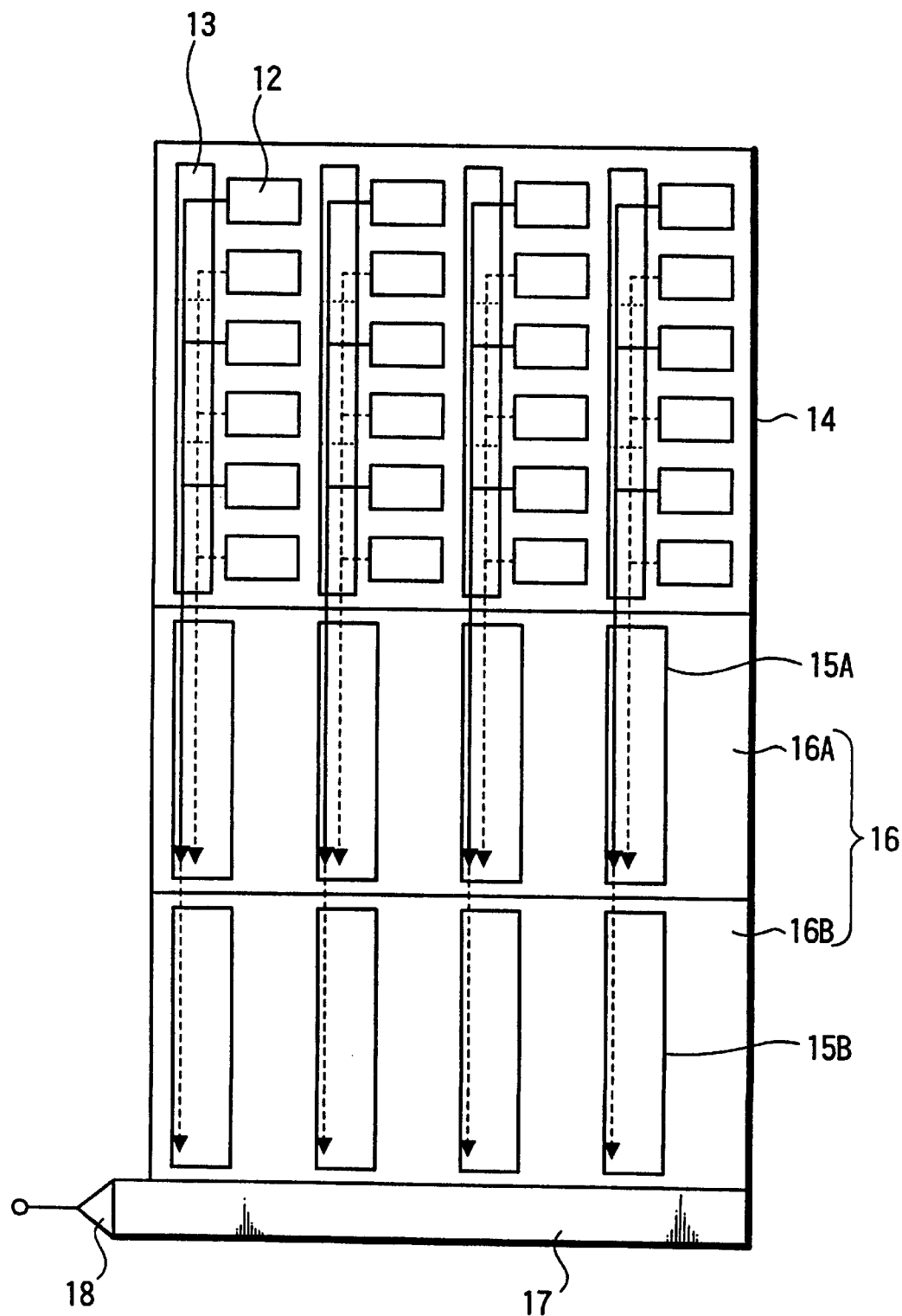
FIG. 2 is a diagram showing the arrangement of a known M-FIT type CCD solid state imaging device.
Figure 3:
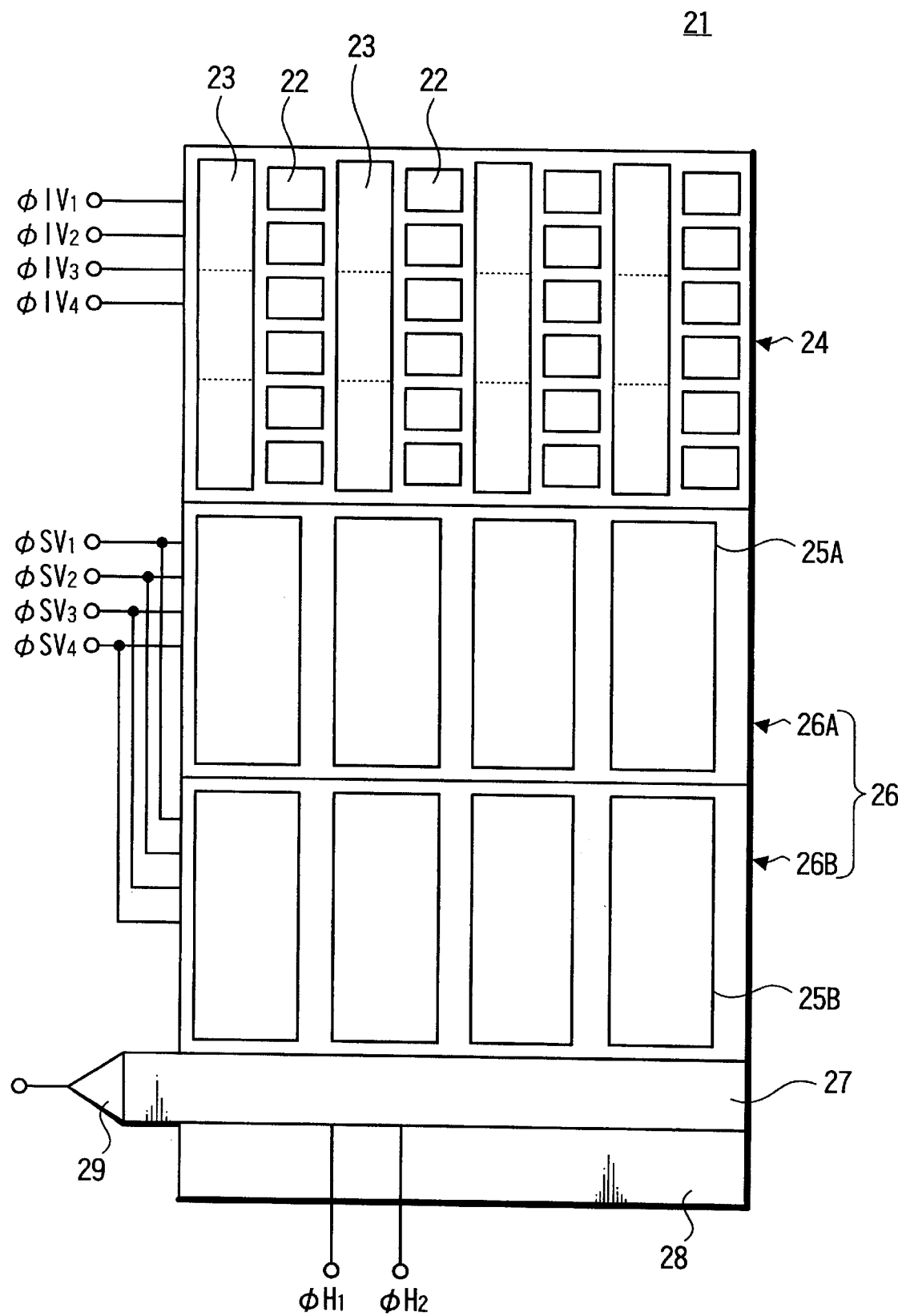
FIG. 3 is a diagram showing the arrangement of an example of a CCD solid state imaging device according to the present invention.

FIG. 3 shows an arrangement of an example of a CCD solid state imaging device 21 according to the present invention.

The CCD solid state imaging device 21 is comprised of an imaging section 24, which is formed of a plurality of light receiving portions 22, each serving as a pixel, arranged in a matrix fashion and of a vertical transfer register 23 of a CCD structure corresponding to each of columns of the light receiving portions 22, a storage section 26 having a vertical transfer register of a CCD structure formed of a transfer portion having a stage number twice as that of the vertical transfer registers 23 in correspondence with each of the vertical transfer registers 23 in the imaging section 24, that is, the storage section 26 formed of a first storage section 26A having a vertical transfer register 25A made of a transfer portion with the same stage number as that of the vertical transfer register 23 and of a second storage section 26B having a vertical transfer register 25B made of a transfer portion with the same stage number as that of the vertical transfer register 23 and contiguous to the first storage section 26A, a horizontal transfer register 27 adjacent to the second storage section 26B, and a smear drain region 28 located on the side of the horizontal transfer register 27 opposite to its side where the second storage section 26B is located for draining a smear component charge thereto. An output section 29 (which includes a charge-voltage conversion portion and an output amplifier) is connected to the horizontal transfer register 27.

Figure 9:
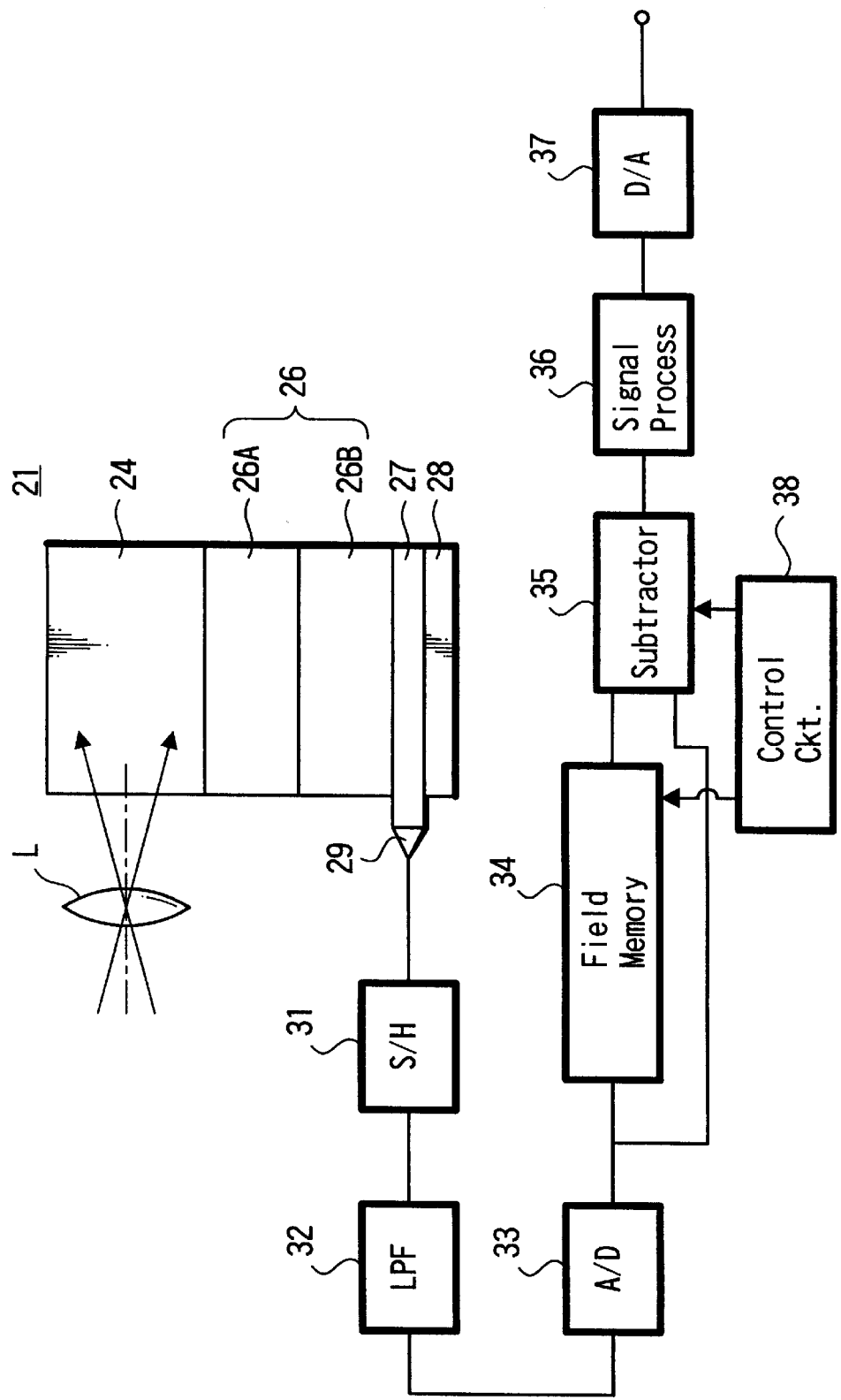
FIG. 9 is a block diagram showing an arrangement of a CCD solid state imaging device applied to the low smear reading according to the present invention.

In a practical camera, as shown in FIG. 9, the incident light from an object (not shown) is imaged on the light receiving portion of the CCD solid state imaging device 21 by an optical system including a lens L and photo-electric converted.

Figure 4:
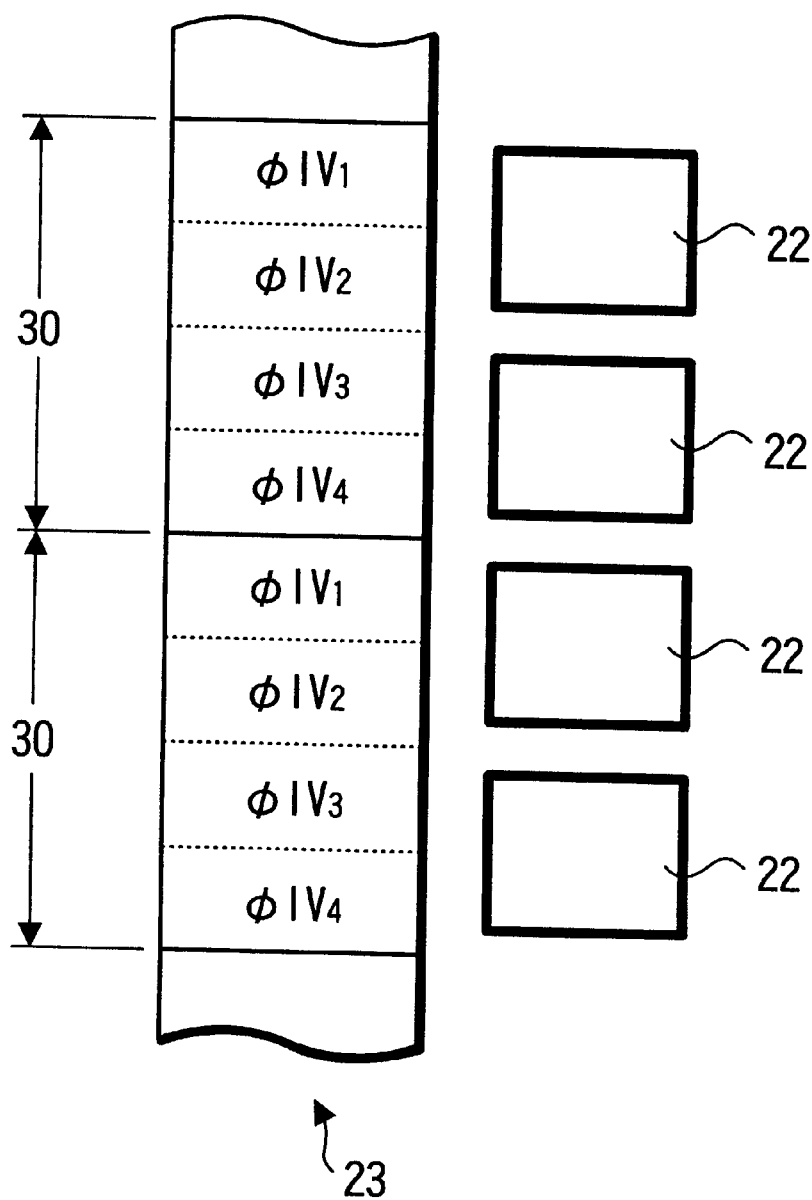
FIG. 4 is a diagram showing the arrangement of a main portion of a vertical transfer register in an imaging section shown in FIG. 3.
Figure 5:
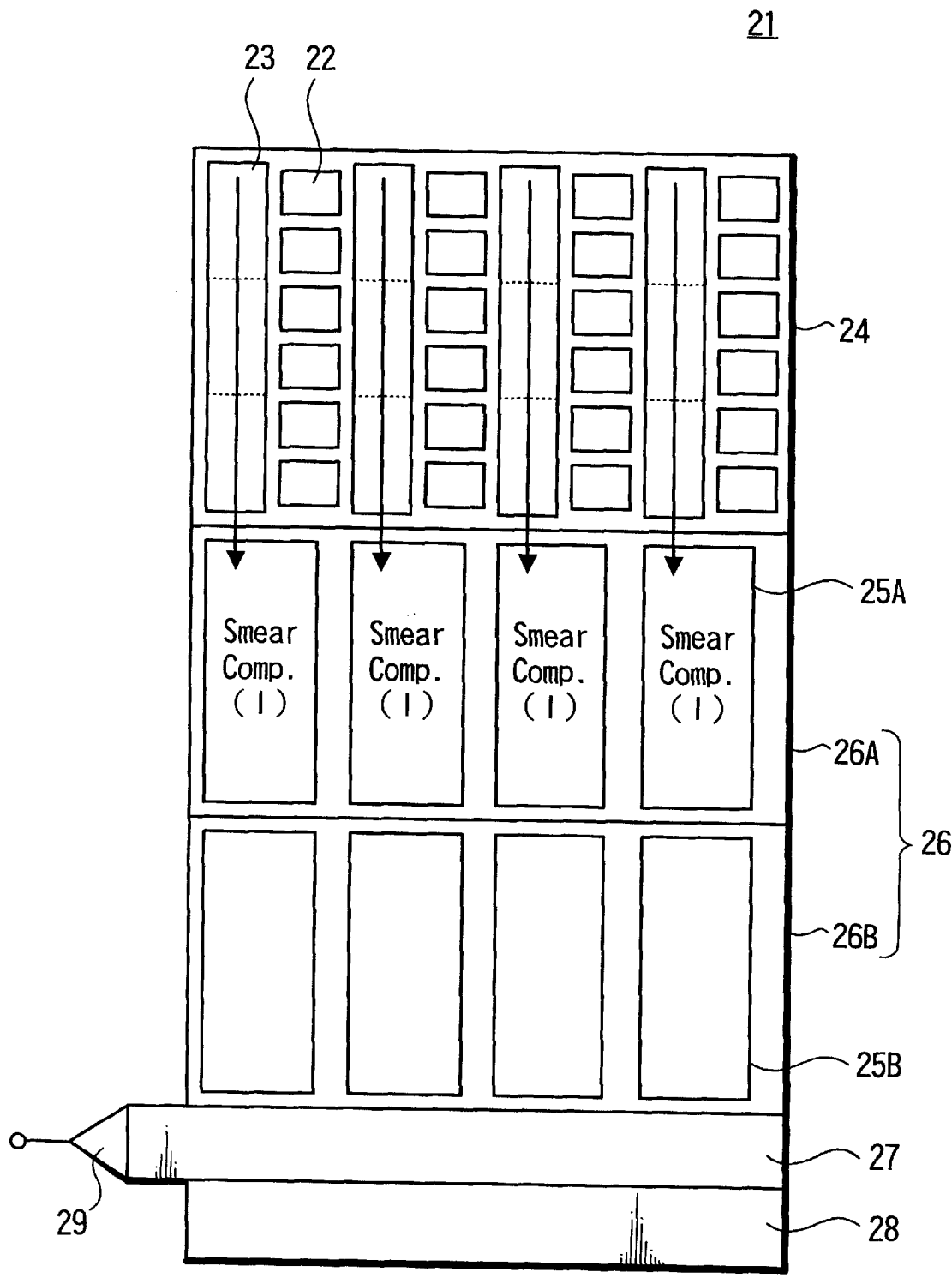
FIG. 5 is a schematic diagram used to explain the inventive driveing method during a first period for a low smear reading according to the present invention.
Figure 6:
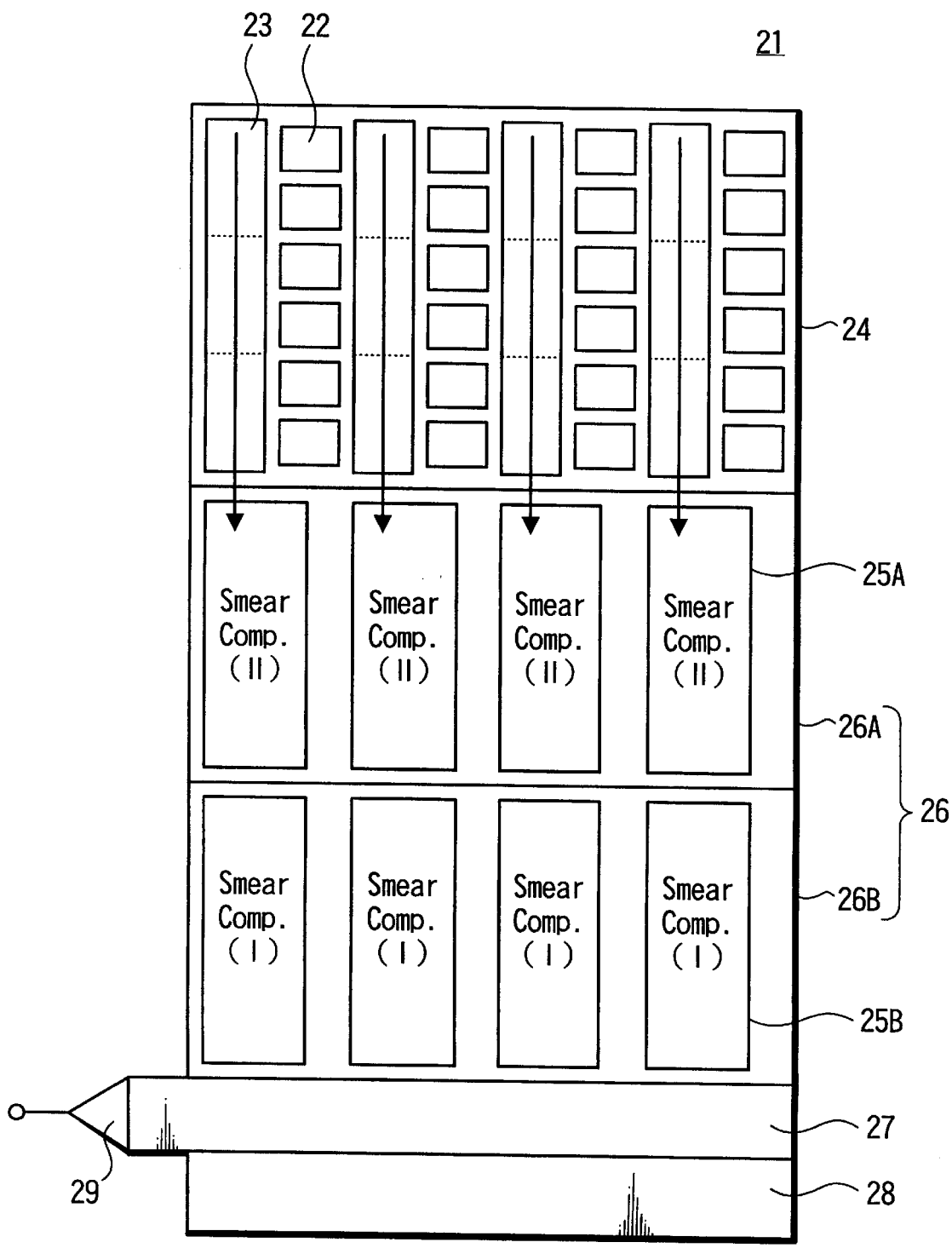
FIG. 6 is a schematic diagram used to explain the driving method during a second period for a low smear reading according to the present invention.
Figure 7:
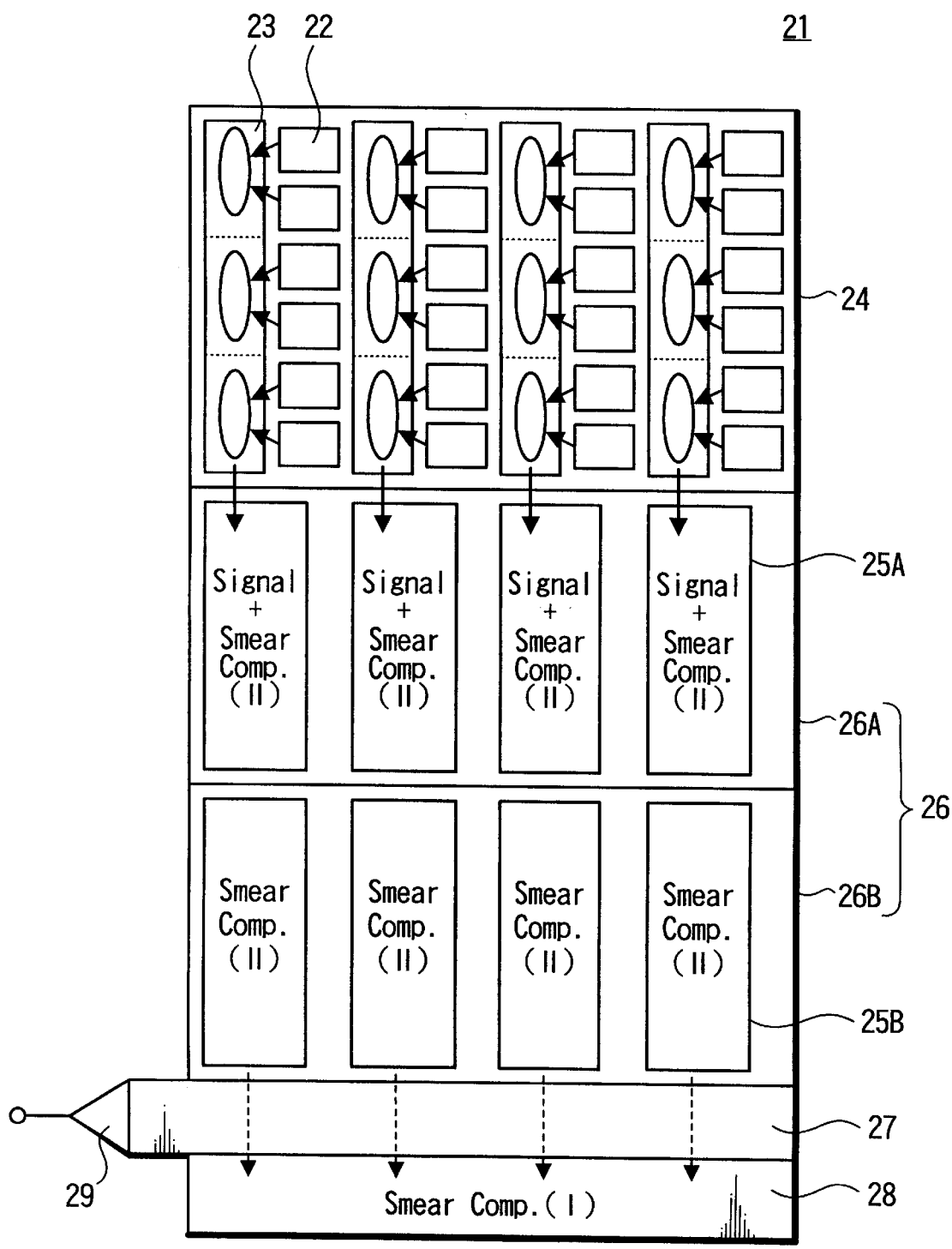
FIG. 7 is a schematic diagram used to explain the driving method during a third, fourth, and fifth period for the low smear reading according to the present invention.

As shown in FIG. 4, the vertical transfer register 23 in the imaging section 24 is formed such that one bit amount 30 in its transfer portion corresponds to two adjacent light receiving portions 22 and the transfer portion has a charge storage capacity capable of transferring a handling charge amount of two light receiving portions 22, namely, two pixels at maximum.

The vertical transfer register 23 in the imaging section 24 is driven by, for example, drive pulses $\Phi IV_1$, $\Phi IV_2$, $\Phi IV_3$, $\Phi IV_4$ of a 4-phase from a drive means, the vertical transfer registers 25A and 25B in the storage sections 26A and 26B are driven by, for example, drive pulses $\Phi SV_1$, $\Phi SV_2$, $\Phi SV_3$, $\Phi SV_4$, of a 4-phase from a drive means, and the horizontal transfer register 27 is driven by, for example, drive pulses $\Phi H_1$, $\Phi H_2$ of a 2-phase from a drive means.

The CCD solid state imaging device 21 with above arrangement can be applied to an imaging device of a so-called low smear reading system which reduces the smear in the interlace mode considerably, a normal field reading system which reads and mixes signal charges of two pixel amounts in the vertical transfer register, an all pixel reading system by an M-FIT system and so on.

Next, a method for driving the above-mentioned CCD solid state imaging device 21 will be explained.

Firstly, a driving method applied to a so-called low smear reading which remarkably reduces the smear in the interlace mode will be described with reference to FIGS. 5 to 9 and FIG. 10 which is a timing chart therefor.

Figure 10:
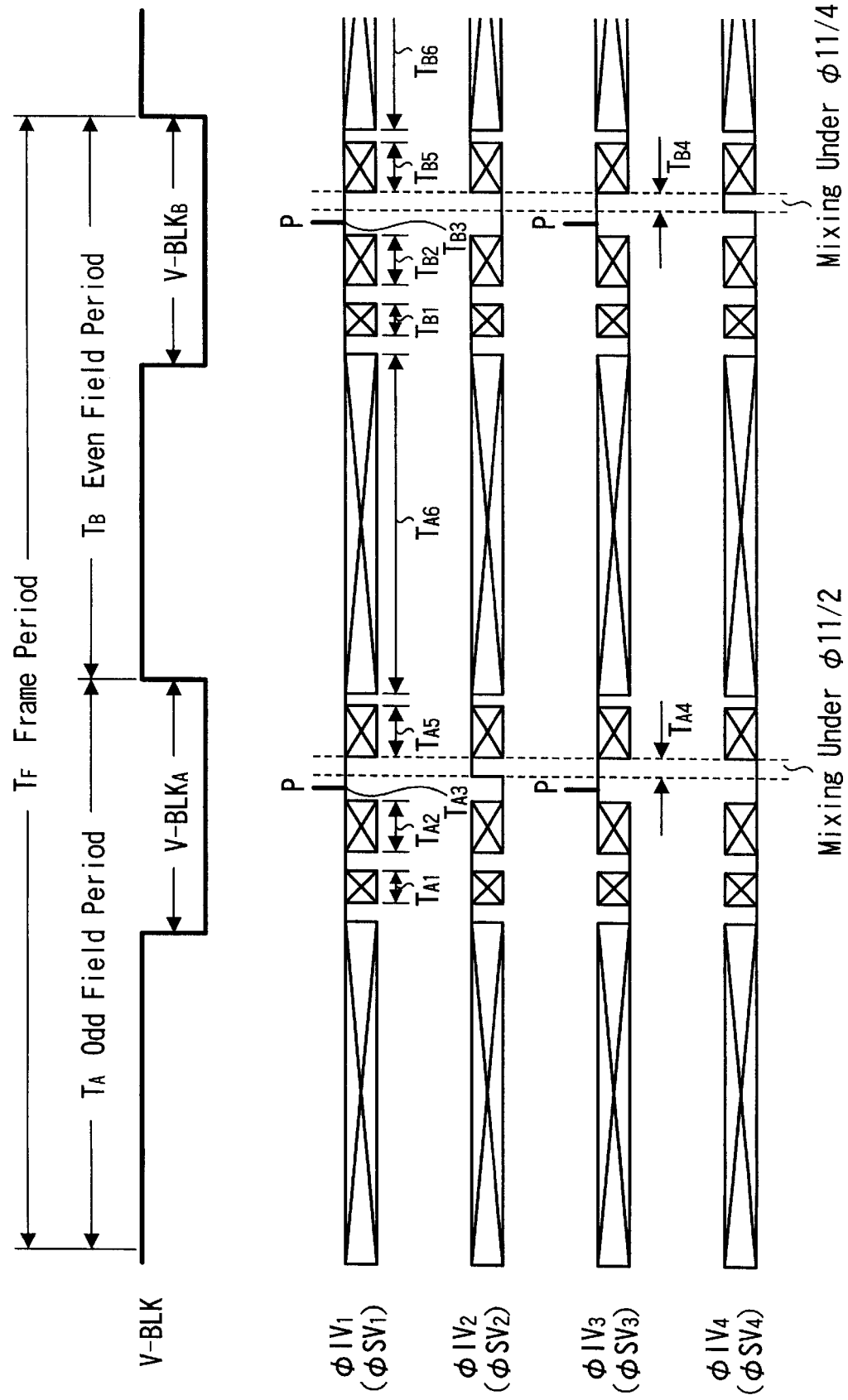
FIG. 10 is a drive timing chart for FIGS. 5 to 8.
Figure 11:
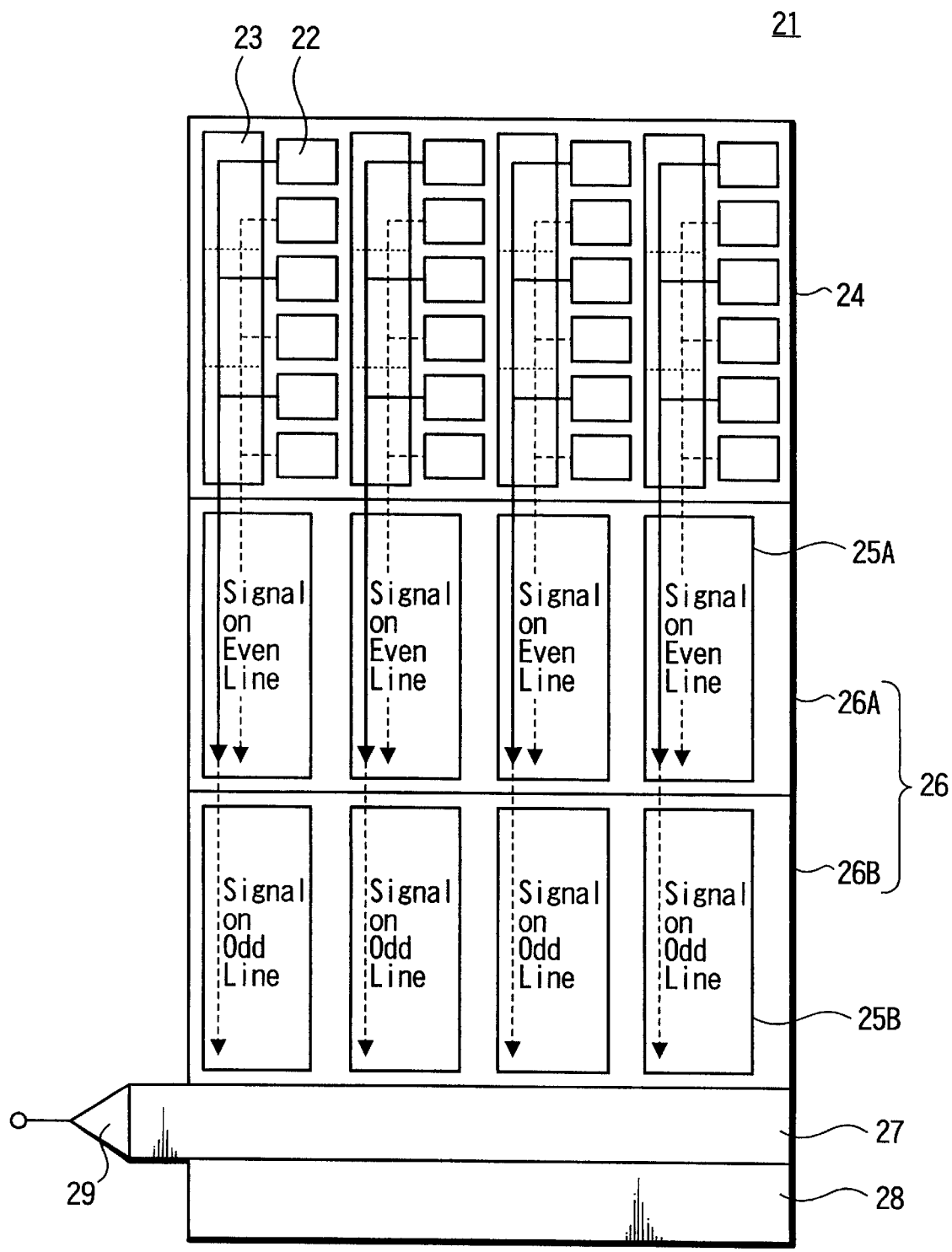
FIG. 11 is a diagram used to explain an inventive driving method for an all pixel reading according to the present invention.

In the low smear reading, during a first period $T_{A1}$ in a vertical blanking period V-BLK$_A$ of an odd field TA in FIG. 10, a first smear component charge I generated in the vertical transfer register 23 in a light receiving and storage period is transferred at a high speed and swept away. In this case, the first smear component charge I is once transferred at a high speed to the vertical transfer register 25A in the first storage section 26A (see FIG. 5).

Then, during a period $T_{A2}$ in the vertical blanking period V-BLK$_A$, the signal charge in the light receiving portion 22 is not read but its one field amount is transferred at a high speed or subjected to a so-called high speed frame shift, namely the vertical transfer register 23 is blank-transferred. Only a second smear component charge II generated during the frame shift is transferred at a high speed to the vertical transfer register 25A in the first storage section 26A and at the same time, the first smear component charge I previously stored in the vertical transfer register 25A is transferred at a high speed to the vertical transfer register 25B in the second storage section 26B (see FIG. 6).

Next, at a time point $T_{A3}$ in the vertical blanking period V-BLK$_A$, a read pulse P in the drive pulses $\Phi IV_1$ and $\Phi IV_3$ is applied, and signal charges of ones of 2 pixels (2 light receiving portions 22) adjacent each other in the vertical direction are read to the transfer portions of the vertical transfer register 23 which are applied with the drive pulses $\Phi IV_1$, and $\Phi IV_3$, respectively. In the following period $T_{A4}$, the drive pulse $\Phi IV_2$ becomes a high level and the signal charges of two pixel amount are mixed in the transfer portion to which the drive pulse $\Phi IV_2$ is applied.

During the next period $T_{A5}$, a high frame shift of one field amount is performed, further, the first smear component charge I in the second storage section 26B is swept to the smear drain region 28, and the second smear component charge II in the first storage section 26A is transferred to the second storage section 26B. Also, during period $T_{A5}$, the signal charge of the two pixel amounts that were mixed during period $T_{A4}$ of the odd field period in the vertical transfer register 23, to which the second smear component charge II generated during the frame shift is added, is transferred to the vertical transfer register 25A in the first storage section 26A (see FIG. 7).

Next, in a period $T_{A6}$ the line shift is performed, the second smear component charge II and the added charge, in which the signal charge is added with the second smear component charge II, are transferred to the horizontal transfer register 27 sequentially at every one line and transferred within the horizontal transfer register 27. Then, a signal of only the second smear component and a picture or image signal containing the second smear component are output from output section 29.

Then, as shown in FIG. 9, the signal of the second smear component is stored through a sample and hold circuit 31, a low-pass filter 32 and an analog to digital conversion circuit 33 in a field memory (storage section) 34. Then, the signal of the smear component from the field memory 34 and the picture signal containing the smear component, which is next outputted from the analog to digital conversion circuit 33 are supplied to a subtracting circuit 35 to be subject to a subtraction processing therein. Thus, a picture signal on the odd field, in which the second smear component is canceled out, is outputted from the subtracting circuit 35. The picture signal is outputted through a signal processing circuit 36 and a digital to analog conversion circuit 37.

A clock signal is supplied to the field memory 34 and the subtracting circuit 35 from a control circuit 38 so that the signal of the second smear component and the picture signal containing the second smear component are synchronized in the subtracting circuit 35.

Further, such a modification may be possible in which the original single field memory 34 is provided by two field memories 34A & 34B (see FIG. 12) and after the signal of the second smear component is memorized in one field memory while the picture signal containing the second smear component is memorized in the other field memory, the signals from the respective field memories are supplied to the subtracting circuit 35 from which a difference signal i.e., a picture signal in which the smear components are canceled, is output.

In the next even field, the similar driving is carried out. On the even field side in FIG. 10, the respective periods and time point corresponding to those on the odd field side are shown each with a suffix B. In the even field, except for the fact that after the signal charges of the other ones of two pixels (two light receiving portions 22) adjacent each other in the vertical direction are read to the transfer portions of the vertical transfer register 23 which are supplied with the drive pulses $\Phi IV_3$ and $\Phi IV_1$, respectively, and the signal charges of two pixels are mixed in the transfer portion supplied with the drive pulse $\Phi IV_4$, the same drive as described in connection with the odd field is carried out.

Figure 8:
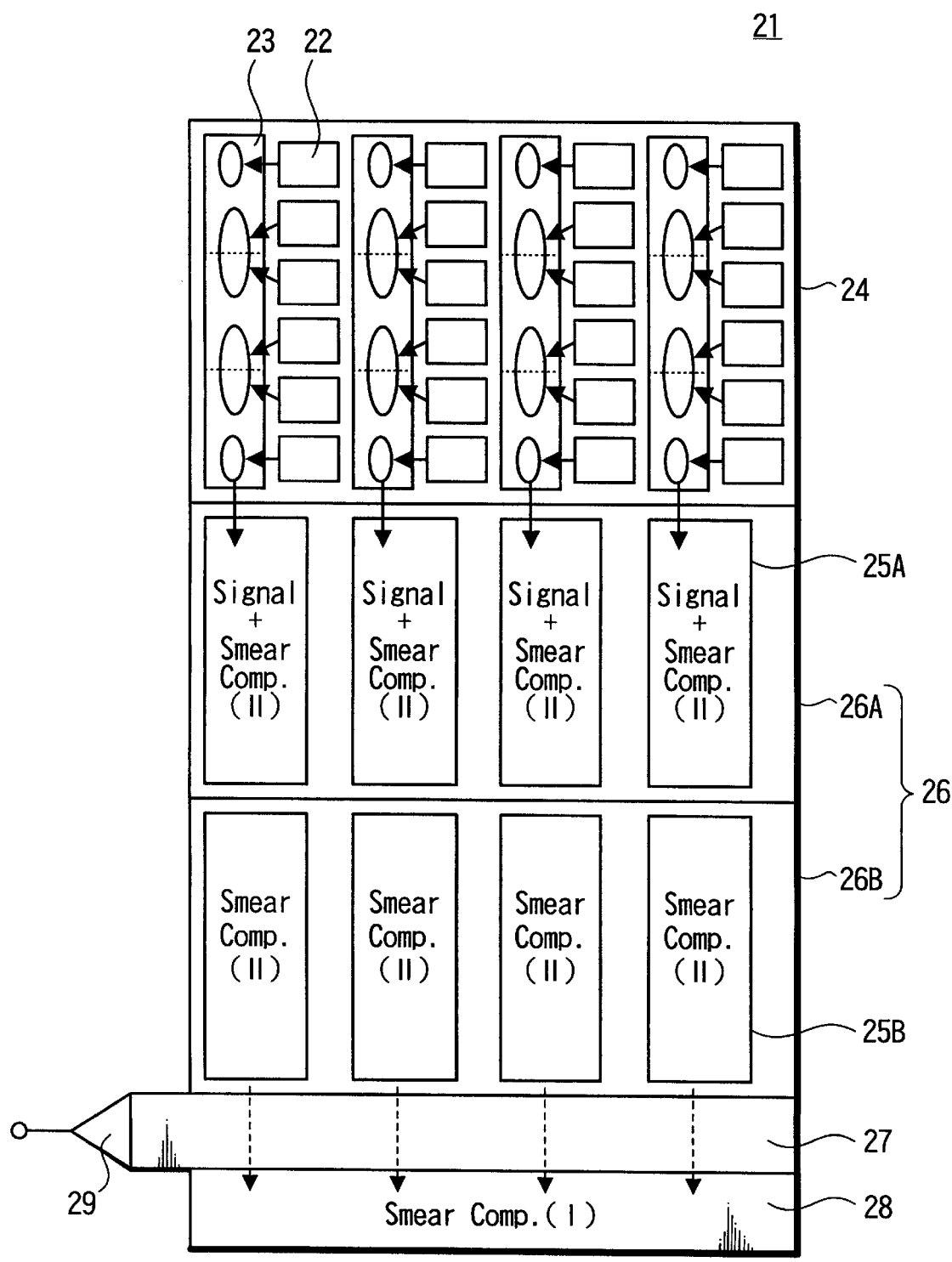
FIG. 8 is a schematic diagram used to explain the driving method during a sixth period for the low smear reading according to the present invention.

FIG. 8 shows such a state that the first smear component change I is swept away to the smear drain region 28, the second smear component charge II is transferred to the second storage section 26B, and an added charge, in which the signal charge in even field is added to the second smear component charge II, is transferred to the first storage section 26A.

Thereafter, the line shift for the signal charge of the second smear component charge II and the signal added with the second smear component is carried out. As described in connection with FIG. 9, in the outside, the signal of the second smear component and the picture signal containing the smear component are subjected to the subtraction processing to thereby output a picture signal in the even field in which the second smear components are canceled out.

According to this driving method, since the smear component generated during the high speed frame shift can also be removed, if it is applied to, for example, a HDTV camera, in which the number of pixels in the vertical direction is increased or the like, the smear component can be reduced considerably.

Because the smear component can be reduced so much, the CCD solid state imaging device 21 of the same arrangement can be commonly used in either of the HDTV camera and the conventional broadcasting camera in the interlace mode.

A driving method when the CCD solid state imaging device 21 is used to read all pixels thereof will be described with reference to FIGS. 11 to 13 and FIG. 14 which is a timing chart for the former. This all pixel reading is the same as the driving method of the M-FIT system.

Figure 14:
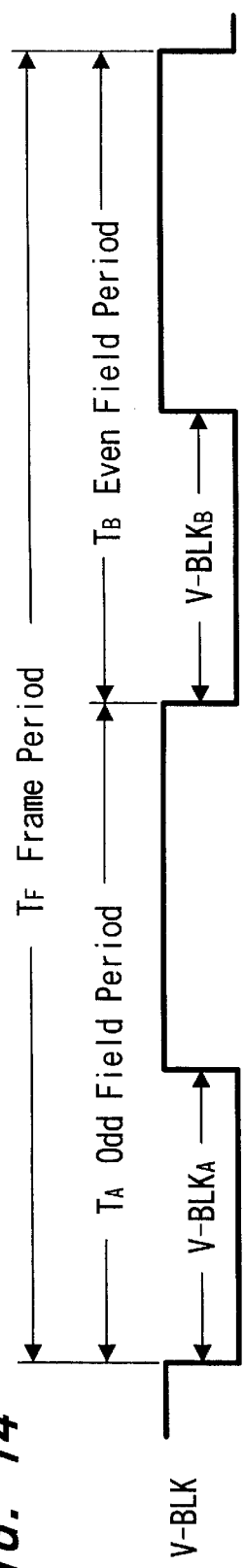
FIG. 14 is a drive timing chart of FIG. 11.
Figure 14:
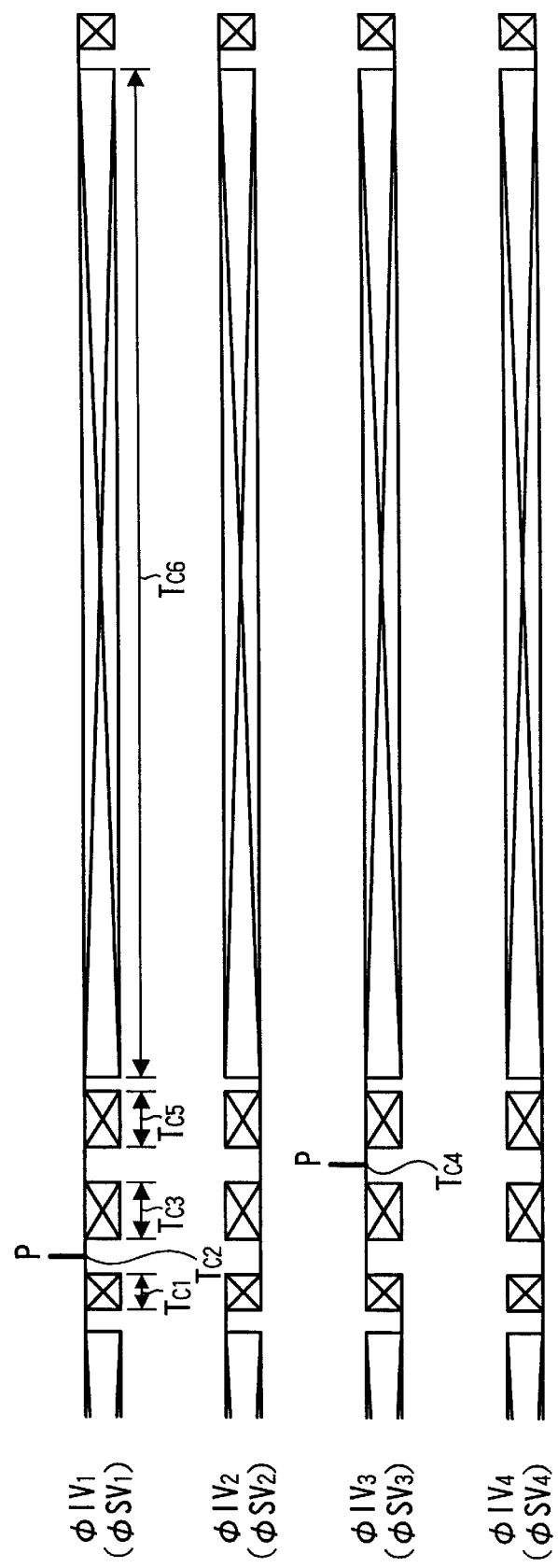

First, in a first period $T_{C1}$ within the vertical blanking period V-BLK$_A$ in, for example, an odd field period $T_A$ of a frame period $T_F$ in FIG. 14, a smear component charge generated in the vertical transfer register 23 during the light receiving and storage period is transferred at a high speed and swept away.

The smear component is stored in the first storage section 26A, then transferred from the first storage section 26A to the second storage section 26B by a first high speed frame shift described later on, and swept away from the second storage section 26B to the drain region 28 by a second high speed frame shift.

Then, at a time point $T_{C2}$, a first read pulse, namely, a read pulse P in the drive pulse $\Phi IV_1$ is applied, only the signal charge of the light receiving portion 22 on the odd line is read to the transfer portion in the vertical transfer section 23 to which the drive pulse $\Phi IV_1$ is applied, and in the next period $T_{C3}$ the first high speed frame shift is performed, whereby the signal charge on the odd line is transferred to the first storage section 26A.

Next, at a time point $T_{C4}$ a second read pulse, namely, a read pulse P in the drive pulse $\Phi IV_3$ is applied, and only the signal charge of the light receiving portion 22 on the even line is read to the transfer portion in the vertical transfer register 23 to which the drive pulse ΦIV$_3$ is applied. In the next period T$_{C5}$, the second high speed frame shift is carried out, and the signal charge on the even line is transferred to the first storage section 26A. At the same time, the signal charge on the odd line in the first storage section 26A is transferred to the second storage section 26B see FIG. 11).

Then, in a period T$_{C6}$ the line shift is carried out, the signal charge on the odd line and the signal charge on the even line stored in the second and first storage sections 26B and 26A, respectively, are transferred sequentially at every one line to the horizontal transfer register 27 and then outputted from the output section 29 after being transferred through the horizontal transfer register 27.

Figure 12:
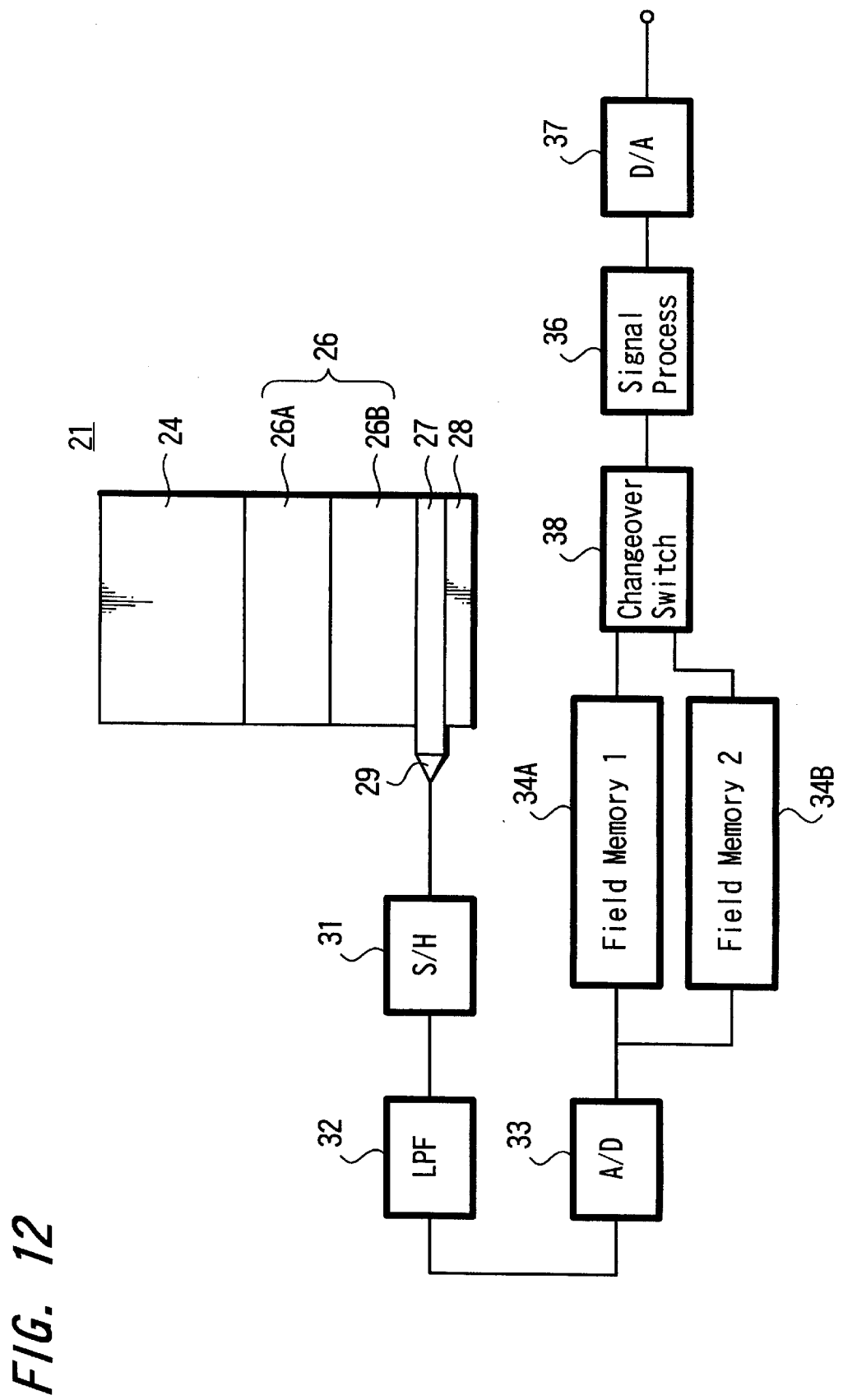
FIG. 12 is a block diagram showing an arrangement of an example of the CCD solid state imaging device applied to an all pixel reading according to the present invention.

Then, as shown in FIG. 12, the output signal on the odd line is stored through a sample and hold circuit 31, a low-pass filter 32 and an analog to digital conversion circuit 33 in a first field memory 34A, while the output signal on the even line is stored in a second field memory 34B similarly through the sample and hold circuit 31, the low-pass filter 32 and the analog to digital conversion circuit 33.

Signals from the first and second field memories 34A and 34B are re-arranged alternatively by a change-over switch circuit 38 and then supplied to a signal processing circuit 36 the output of which is digital-to-analog converted by a digital to analog conversion circuit 37 which then outputs a picture signal of one frame.

Figure 13:
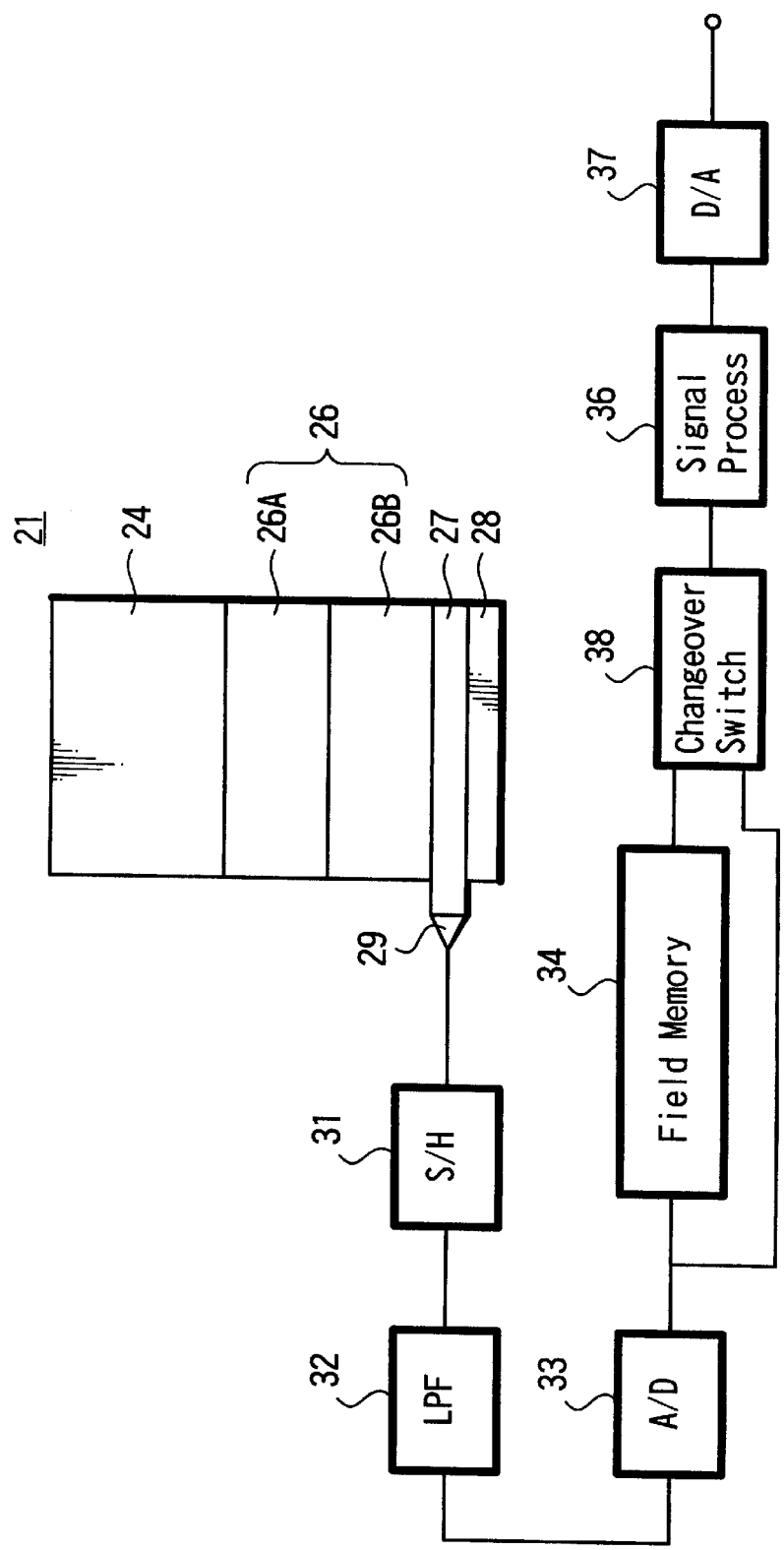
FIG. 13 is a block diagram showing an arrangement of another example of the CCD solid state imaging device applied to the all pixel reading according to the present invention.

In the example shown in FIG. 12, although two field memories 34A and 34B are provided, such a modification is possible in which, as shown in FIG. 13, only one field memory 34 is provided, the signal on the odd line is memorized in this field memory 34, an output therefrom is supplied to the change-over switch 38 to which also supplied directly is the signal on the even line next outputted from the analog to digital conversion circuit 33, whereby the signals on the odd and even lines are re-arranged by the change-over switch 38.

As described above, the CCD solid state imaging device 21 according to the present invention can be applied to the all pixel reading of the M-FIT system.

As the field memories 34A, 34B or field memory 34 used in the all pixel reading of M-FIT system, the field memory 34 used in the low smear reading mentioned above or two field memories, though not shown, can be used divertingly.

A driving method when the CCD solid state imaging device 21 is used and the normal field reading is applied thereto will be described with reference to FIGS. 15 to 17 and FIG. 18 which is a timing chart of the former.

Figure 18:
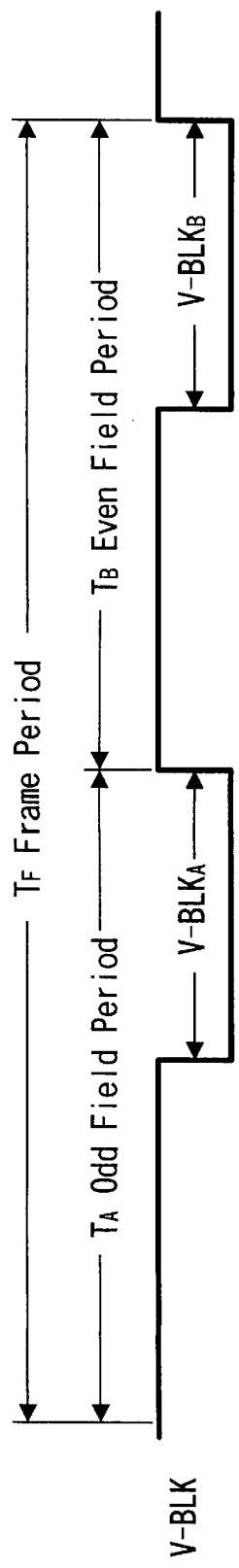
FIG. 18 is a drive timing chart of FIGS. 16 and 17.
Figure 18:
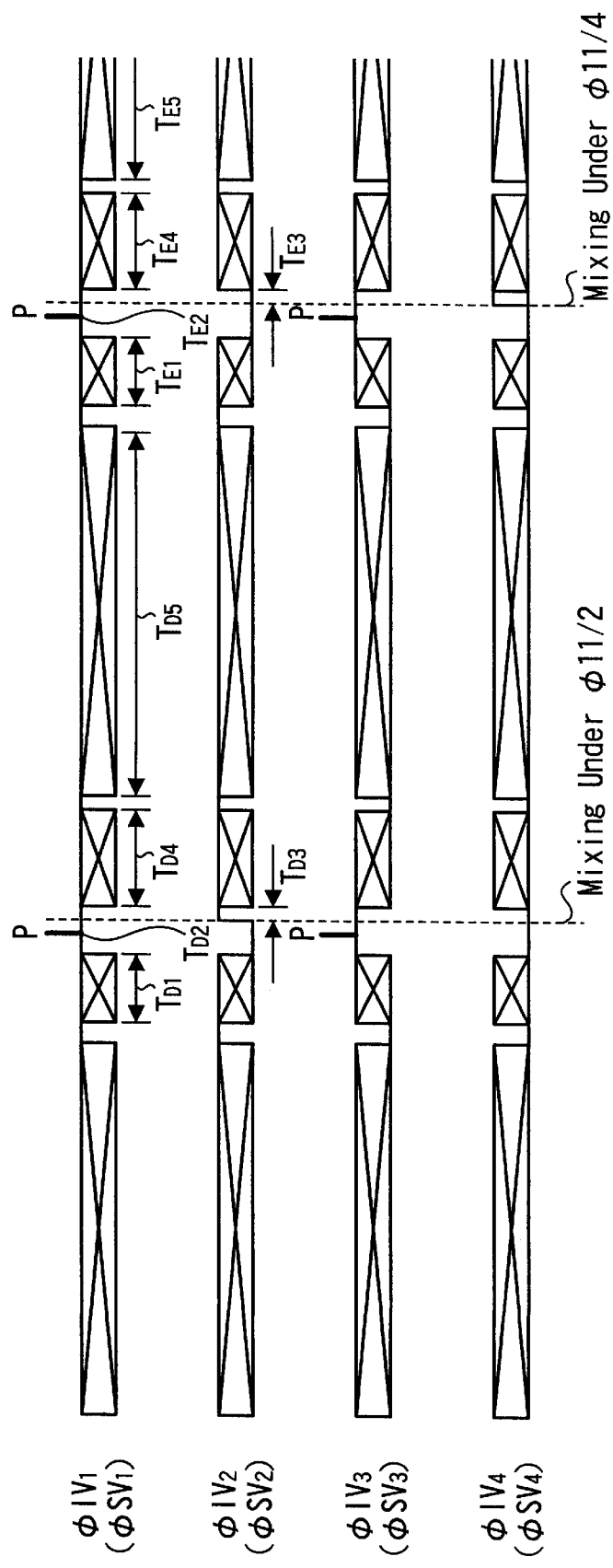

Upon the field reading, in a first period TD1 of the vertical blanking period V-BLK$_A$ in the odd field period TA in FIG. 18, the smear component charge generated in the vertical transfer register 23 during the light receiving and storage period is transferred at a high speed and swept away.

The above smear component may be swept away to the smear drain region 28 during the period T$_{D1}$, or it is once transferred at a high speed to the first or second storage section 26A or 26B and swept to the smear drain region 28 away from the first or second storage section 26A or 26B when the signal charge is subjected to the high speed frame shift later.

Then, a read pulse P in the drive pulses ΦIV$_1$ and ΦV$_3$ is applied at a time point T$_{D2}$, the signal charges of ones of two pixels (two light receiving portions 22) adjacent each other in the vertical direction are read to the transfer portions of the vertical transfer register 23 which are respectively applied with the drive pulses ΦIV$_1$ and ΦIV$_3$. In the next period T$_{D3}$, the drive pulse ΦIV$_2$ becomes high in level, and the signal charges of two pixels are mixed in a transfer portion to which the drive pulse ΦIV$_2$ is applied.

Figure 15:
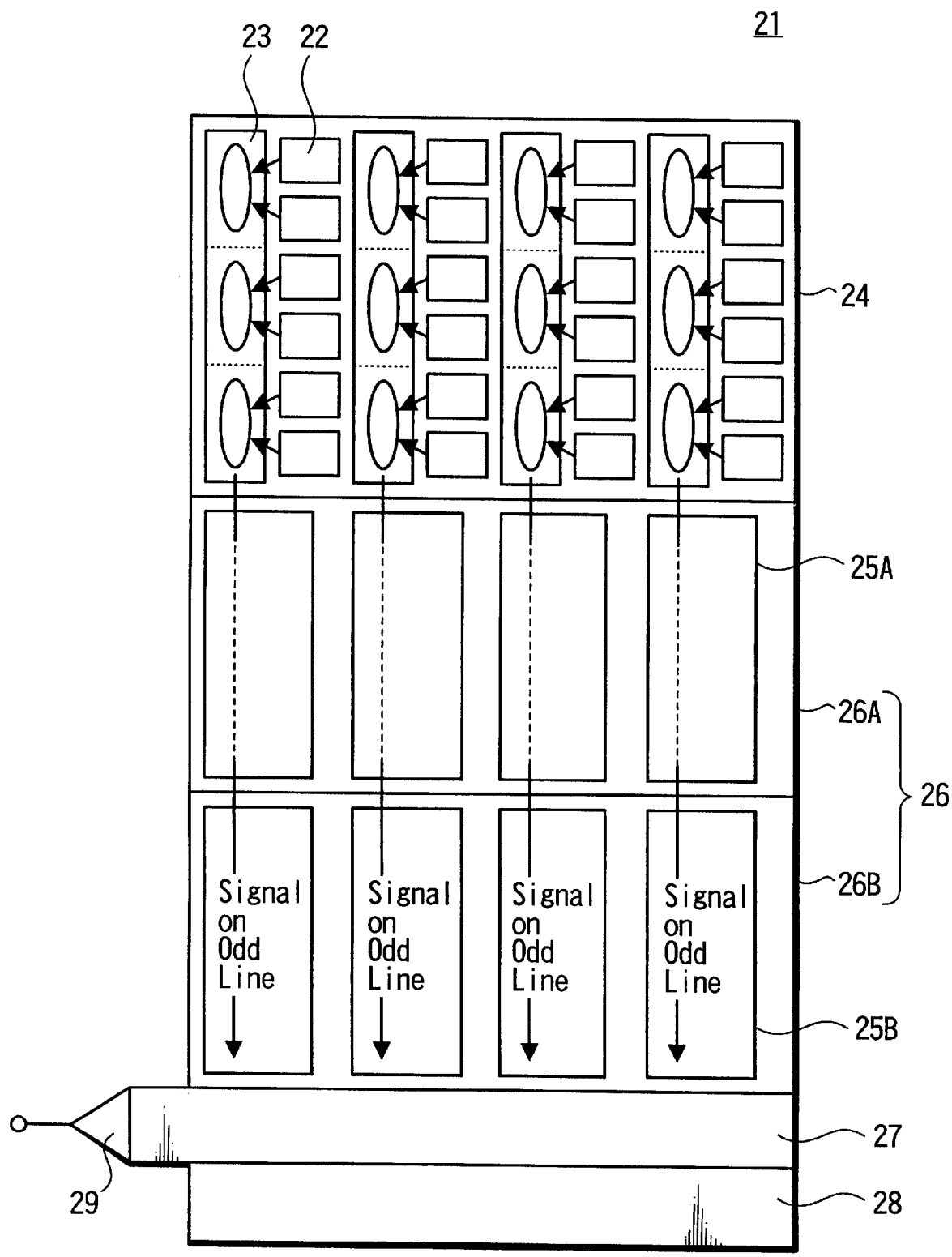
FIG. 15 is a schematic diagram used for explaining a driving method for a normal field reading during odd-line processing according to the present invention.
Figure 16:
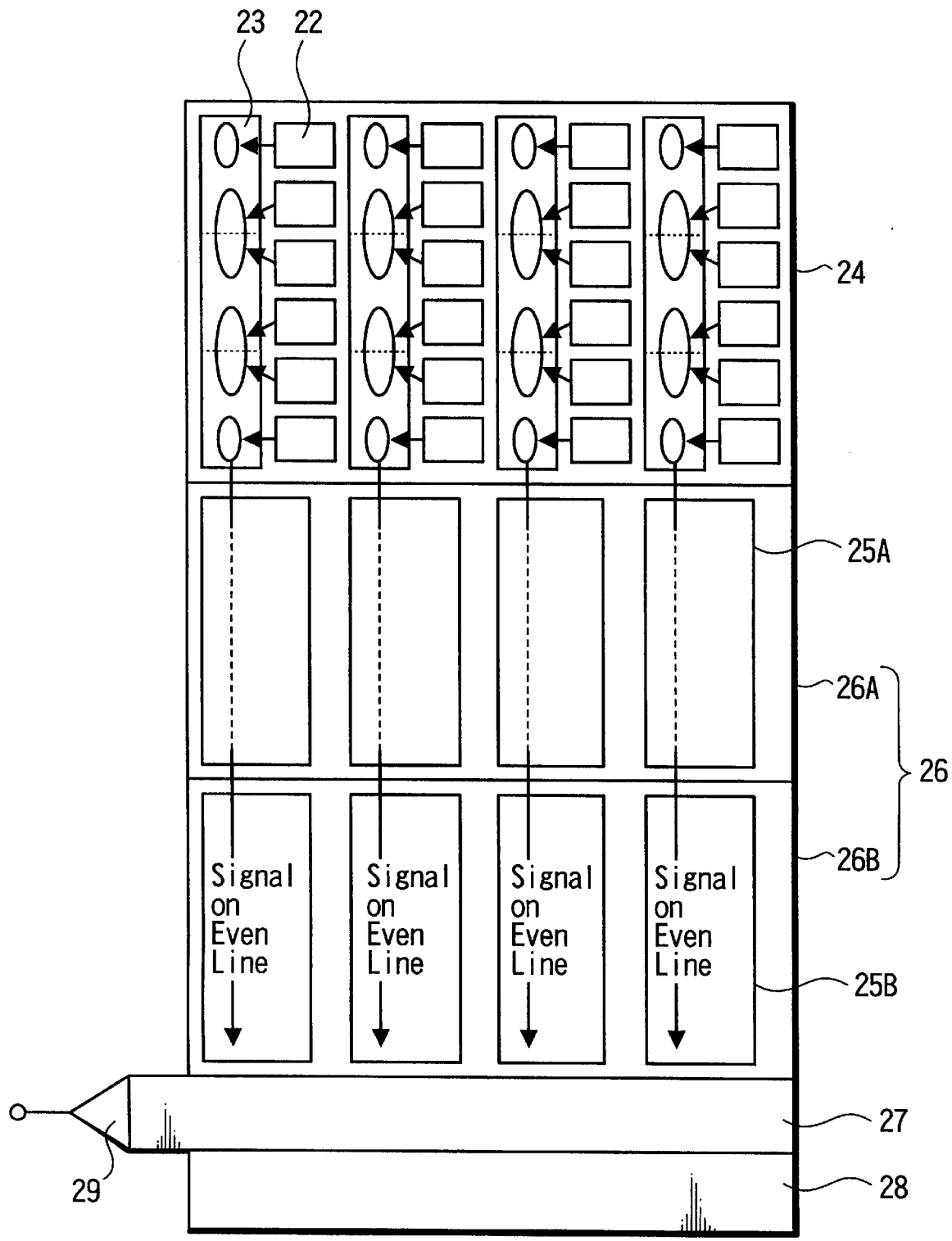
FIG. 16 is a schematic diagram used to explain a driving method for the normal field reading during even-line processing according to the present invention.

In the next period T$_{D4}$, the high speed frame shift is performed, and the signal charge in the odd field is transferred to the second storage section 26B passed through the first storage section 26A (see FIG. 15).

Then, in a period T$_{D5}$ the line shift is performed, the signal charge in the second storage section 26B is sequentially transferred to the horizontal transfer register 27 at every one line, transferred within the horizontal transfer register 27 and is outputted as a signal of the odd field from the output section 29.

Figure 17:
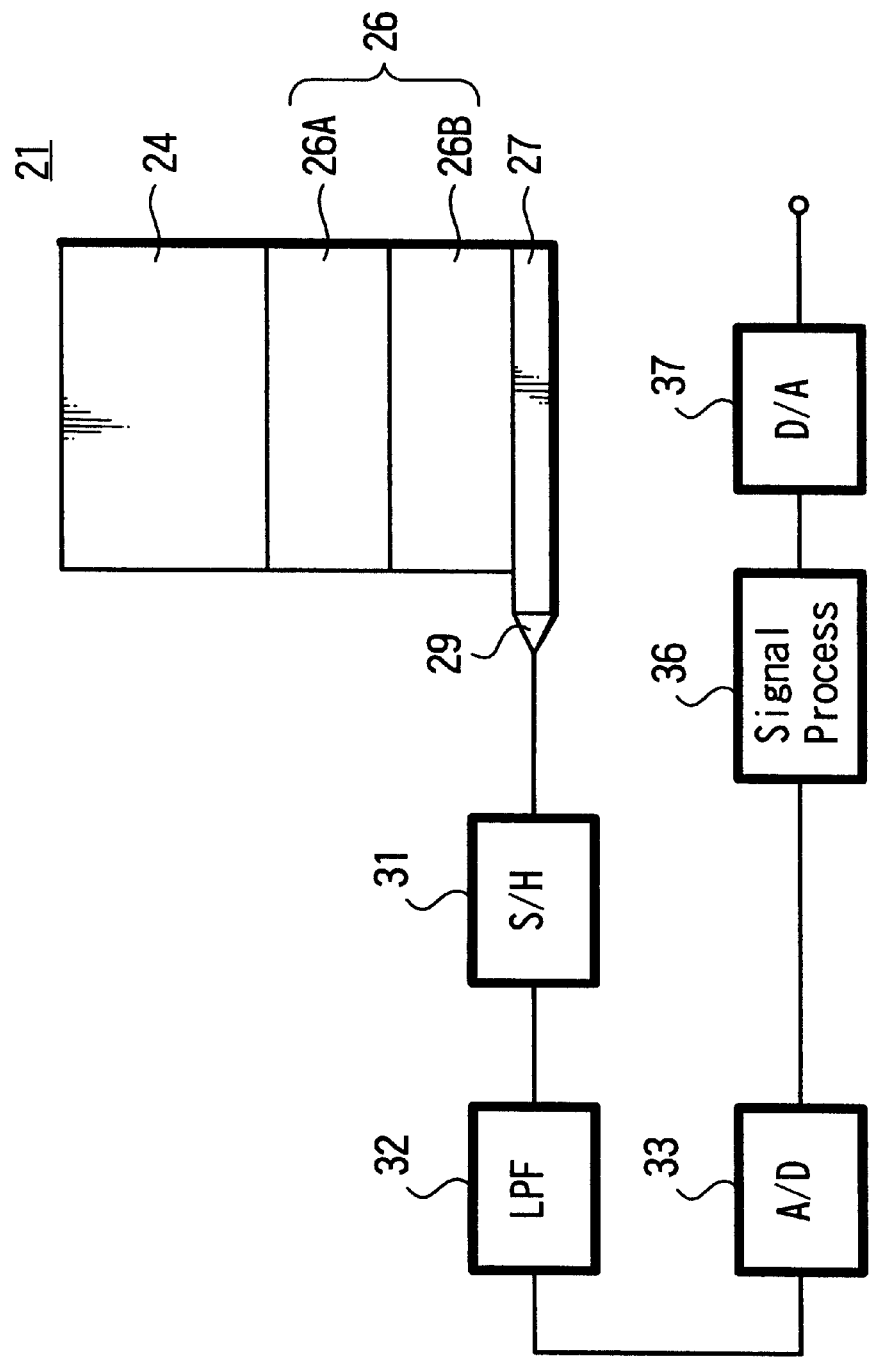
FIG. 17 is a block diagram showing an arrangement of the CCD solid state imaging device applied to the normal field reading according to the present invention.

As shown in FIG. 17, the above output signal is supplied through a sample and hold circuit 31 and a low-pass filter circuit 32 to an analog to digital conversion circuit 33 in which it is subjected to an A/D (analog to digital) conversion. The output signal from the analog to digital conversion circuit 33 is supplied to a signal processing circuit 36 whose output is supplied to a digital to analog (D/A) conversion circuit 37 to be subjected to a D/A conversion processing. Then, the signal of the odd field is outputted from the D/A conversion circuit 37.

In the case of field reading, it may be possible that the A/D conversion and hence the D/A conversion are not carried out and the signal is subjected to the signal processing in the form of an analog signal.

Next, within the vertical blanking period V-BLK$_B$ in the even field period T$_B$, similar to the above, the smear component charge generated in the vertical transfer register 23 during the light receiving and storage period is transferred at a high speed and swept away. Then, the signals of the other ones of two pixels (two light receiving portions 22) adjacent each other in the vertical direction are each read to the vertical transfer register 23 and mixed therein. Upon the next high speed frame shift, the signal charge in the even field is transferred to the second storage section 26B passing through the first storage section 26A (see FIG. 16).

On the even field side in FIG. 18, the respective periods and time point corresponding to those on the odd field side are each marked with a suffix E instead of D and shown.

In the even field, after the signal charges of the other ones of two pixels (two light receiving portions 22) adjacent each other in the vertical direction are read to the transfer portions of the vertical transfer register 23 which are respectively applied with the drive pulses ΦIV$_3$ and ΦIV$_1$, the signal charges of two pixels are mixed in the transfer portion applied with the drive pulse ΦIV$_4$. The other driving method is the same as that described in connection with the odd field, and the signal is outputted through the external circuits shown in FIG. 17 as the signal of the even number field.

According to the example of the present invention, the CCD solid state imaging device 21, in which the first and second storage sections 26A and 26B having the vertical transfer registers 25A and 25B each with the same stage number as that of the vertical transfer register 23 in the imaging section 24 are provided, and the vertical transfer register 23 is provided with the charge storage capacity capable of transferring the maximum handling charge of two pixel amount, is used. After the first smear component charge is swept away at a high speed, the first high speed frame shift is performed without reading the signal charge for the vertical transfer register 23. Then, the signal charge is read to the vertical transfer register 23, the second high speed frame shift is performed, the second smear component charge generated during the frame shift in the first high speed frame shift is stored in the second storage section 26B while the added charge of the second smear component charge generated during the frame shift at the second high speed frame shift added to the signal charge is stored in the first storage section 26A, respectively, and the difference between the signal corresponding to the second smear component charge and the signal corresponding to the added charge is produced in the outside, whereby the smear component can be reduced considerably.

Even if the present invention is applied to the HDTV camera in the interlace mode or the like, the smear component can be reduced as compared with the prior art. Therefore, it is possible that the CCD solid state imaging device 21 of the present invention is used common to the HDTV camera and the conventional broadcasting camera.

Further, the CCD solid state imaging device 21 of the present invention can be applied to the normal field reading or the all pixel reading of the M-FIT system and hence copes with various reading systems. The CCD solid state imaging device 21 is also used in a movie camera (all pixel reading) in which, for example, 24 frames per 1 second are picked up.

In the interlace of the conventional M-FIT system, the signals of two pixels are mixed outside the imaging device, so that the S/N ratio is deteriorated by about 3dB. However, in the interlace of the present invention, since the signal charges of two pixels are mixed in the vertical transfer register 23 of the imaging section 24, there is no deterioration of S/N ratio.

In the present invention, if the supply of drive pulse, the external circuit system and so on are changed over, one imaging camera can be used in common to the HDTV camera and the conventional broadcasting camera.

Further, it is possible to form an imaging camera having both the functions of low smear reading and all pixel reading, or an imaging camera having the functions of low smear reading, all pixel reading and field reading.

According to the CCD solid state imaging device of the present invention, since the smear component, generated in the vertical transfer register during the period in which the signal charge in the imaging section is transferred at a high speed to the storage section (so-called high speed frame shift), can be removed, the smear component can be reduced drastically.

Because the smear component can be reduced considerably by the CCD solid state imaging device of the present invention, it can be used in the HDTV camera and the conventional broadcasting camera used in the interlace mode commonly.

Further, the CCD solid state imaging device of the present invention can cope with the normal field reading, all pixel reading of M-FIT system and so on, and also be used as a movie camera (all pixel reading) in common.

According to the driving method for the CCD solid state imaging device of the present invention, the smear component is reduced much, and when it is applied to the HDTV camera used in the interlace mode, its smear component can be reduced. Accordingly, when the driving method of the present invention is employed, any of the HDTV camera and the conventional broadcasting camera can be formed by using a common CCD solid state imaging device.

Having described preferred embodiments of the present invention with reference to the accompanying drawings, it is to be understood that the present invention is not limited to the above-mentioned embodiments and that various changes and modifications can be effected therein by one skilled in the art without departing from the spirit or scope of the present invention as defined in the appended claims.

What is claimed is:

1. A method for driving a CCD solid state imaging device comprising an imaging section having a light receiving portion, and a vertical transfer register, a first storage section having a vertical transfer register, a second storage section having a vertical transfer register, a horizontal transfer register, and an output section, said method comprising the steps of:

generating a first smear component charge in said imaging section vertical transfer register during a light receiving and storage period;

transferring said first smear component charge to said first storage section vertical transfer register during a first period in a vertical blanking period;

transferring a one-field amount of a signal charge of said light receiving portion, without performing a read on said light receiving portion, to said imaging section vertical transfer region during a second period;

generating a second smear component charge in said vertical transfer register of said imaging section;

transferring said second smear component charge from said imaging section vertical transfer region to said first storage section vertical transfer region during said second period;

reading a first pixel charge and a second pixel charge from a first light receiving portion and a second light receiving portion that are vertically adjacent to one another into said imaging section vertical transfer register while applying a first and third drive pulse respectively to said imaging section vertical transfer register;

mixing, in said imaging section vertical transfer register, said first pixel charge and said second pixel charge while applying a second drive pulse to said imaging section vertical transfer register during a fourth period;

performing a high speed frame shift of one field amount during a fifth period;

transferring said second smear component charge from said first storage section vertical transfer register to said second storage section vertical transfer register during said fifth period;

adding said mixed first pixel charge and said second pixel charge to said second smear component charge during said fifth period which creates a signal plus second smear component charge;

transferring said signal plus second smear component charge from said image section vertical transfer register to said first storage section vertical transfer register during said fifth period;

performing a line shift during a sixth period;

transferring said signal plus second smear component charge into said horizontal transfer register during said sixth period; and outputting only said second smear component charge and a picture signal containing said second smear component charge as signals from said output section.

2. The method according to claim 1, further comprising the step of sweeping said first smear component charge into a smear drain region of said CCD solid state imaging device during said fifth period.

3. The method according to claim 1, further comprising the steps of:
   sampling said second smear component charge signal output from said output section in a sample and hold circuit;
   filtering said second smear component charge signal with a low-pass filter;
   converting said second smear component charge signal with an analog to digital conversion circuit;
   storing said converted second smear component charge signal in a field memory;
   sampling said picture signal containing said second smear component charge output from said output section in said sample and hold circuit;
   filtering said picture signal containing said second smear component charge with said low-pass filter;
   converting said picture signal containing said second smear component charge with said analog to digital conversion circuit;
   subtracting, in a subtracting circuit, said stored converted second smear component charge signal from said converted said picture signal, thus producing a smear component cancelled picture signal;
   processing said smear component cancelled picture signal in a signal processing circuit; and
   converting said smear component cancelled picture signal to an analog smear component cancelled picture signal with a digital to analog conversion circuit; and
   outputting said analog smear component cancelled picture signal.

4. The method according to claim 3, further comprising the steps of:
   storing said converted picture signal containing said second smear component charge in a second field memory; and
   providing said stored converted picture signal containing said second smear component charge to said subtracting circuit in said step of subtracting.

5. A method for driving a CCD solid state imaging device comprising
   an imaging section having a light receiving portion, and a vertical transfer register,
   a first storage section having a vertical transfer register,
   a second storage section having a vertical transfer register,
   a horizontal transfer register, and
   an output section,
   said method being used to read data in an all-pixel mode comprising the steps of:
      generating a smear component charge in said imaging section vertical transfer register during a light receiving and storage period in a first period;
      transferring said smear component charge to said first storage section vertical transfer register and then transferring said smear component charge to said second storage section vertical transfer register by a first high speed frame shift;
      reading a signal charge of said light receiving portion on only an odd line, which is an odd-line signal charge, to said image section vertical transfer register after applying a first read pulse in a first drive pulse to said image section vertical transfer register at a second time point;
      transferring said odd-line signal charge from said image section vertical transfer register to said first storage section vertical transfer register during a third period in which said first high speed frame shift is performed;
      reading a signal charge of said light receiving portion on only an even line, which is an even-line signal charge, to said image section vertical transfer register after applying a second read pulse in a third drive pulse to said image section vertical transfer register at a fourth time point;
      transferring said even-line signal charge from said image section vertical transfer register to said first storage section vertical transfer register during a fifth period in which said second high speed frame shift is performed;
      transferring said odd-line signal charge from said first storage section vertical transfer register to said second storage section vertical transfer register during said fifth period;
      transferring said odd-line signal charge to said horizontal transfer register and outputting said odd-line signal charge from said output section during a sixth period in which a line shift is carried out; and
      transferring said even-line signal charge to said horizontal transfer register and outputting said even-line signal charge from said output section during a sixth period in which a line shift is carried out.

6. The method according to claim 5, further comprising the step of sweeping said smear component charge into a smear drain region of said CCD solid state imaging device by said second high speed frame shift.

7. The method according to claim 5, further comprising the steps of:
   sampling said odd-line signal output from said output section in a sample and hold circuit;
   filtering said odd-line signal with a low-pass filter;
   converting said odd-line signal with an analog to digital conversion circuit;
   storing said converted odd-line signal in a field memory;
   sampling an even-line signal output from an output section in said sample and hold circuit;
   filtering said picture signal containing said second smear component charge with said low-pass filter;
   converting said even-line signal with said analog to digital conversion circuit;
   providing said stored odd-line signal in said field memory to a change-over switch;
   providing said converted even-line signal to said change-over switch;
   combining said odd-line signal and said even-line signals by said change-over switch producing a combined signal;
   processing said combined signal in a signal processing circuit;
   converting said combined signal to an analog combined signal with a digital to analog conversion circuit; and
   outputting said analog combined signal.

8. The method according to claim 7, further comprising the steps of:
   storing said even-line signal in a second field memory; and
   providing said stored even-line signal to said change-over switch in said step of combining said odd-line signal and said even-line signal.

9. A method for driving a CCD solid state imaging device comprising
   an imaging section having a light receiving portion, and a vertical transfer register, a first storage section having a vertical transfer register,
a second storage section having a vertical transfer register,
a horizontal transfer register, and
an output section,
said method being used to read data in a normal field reading mode comprising the steps of:
during an odd-field reading,
generating a smear component charge in said imaging section vertical transfer register during a light receiving and storage period in a first period;
transferring said smear component charge to said first storage section vertical transfer register and then transferring said smear component charge to said second storage section vertical transfer register by a first high speed frame shift;
reading a first pixel charge and a second pixel charge from a first light receiving portion and a second light receiving portion that are vertically adjacent to one another into said imaging section vertical transfer register while applying a first and third drive pulse respectively to said imaging section vertical transfer register;
mixing, in said imaging section vertical transfer register, said first pixel charge and said second pixel charge while applying a second drive pulse to said imaging section vertical transfer register during a third period, producing a combined pixel charge;
performing a high speed frame shift of one field amount during a fourth period;
transferring said combined charge from said image section vertical transfer register to said second storage section vertical transfer register through said first storage section vertical transfer register during said fourth period;
performing a line shift during a fifth period;
transferring said combined charge into said horizontal transfer register during said fifth period;
outputting said combined charge as odd-field signals from said output section; and
repeating all preceding steps during an even-field reading, but wherein said step of mixing said first pixel charge and second pixel charge occurs while applying a fourth drive pulse to said imaging section vertical transfer register, and wherein said step of outputting said combined charge outputs even-field signals from said output section.

10. The method according to claim 9, further comprising the step of sweeping said smear component charge into a smear drain region of said CCD solid state imaging device.

11. The method according to claim 9, further comprising the steps of:
sampling said odd-field signals and said even-field signals in a sample and hold circuit;
filtering said odd-field signals and said even-field signals with a low-pass filter;
processing said odd-field signals and said even-field signals with a signal processing circuit; and
outputting said processed odd-field signals and said even-field signals from said signal processor.

12. The method according to claim 11, further comprising the steps of:
converting said odd-field signals and said even-field signals with an analog to digital signals with a digital conversion circuit and providing said converted signals to said signal processor as inputs; and
converting said processed odd-field signals and even-field signals to analog processed odd-field signals and even-field signals.

13. A CCD solid state imaging device comprising:
an imaging section having light receiving portions arranged in a matrix manner, and vertical transfer registers arranged to corresponding columns of said light receiving portions;
a first storage section having vertical transfer registers, each of which correspond to one of said imaging section vertical transfer registers;
a second storage section having vertical transfer registers, each of which correspond to one of said first storage section vertical transfer registers;
a horizontal transfer register adjacent to said second storage section;
a smear drain region located on a side of said horizontal transfer register opposite said adjacent second storage section;
an output section connected to said horizontal transfer register;
a sample and hold circuit that produces a sampled signal from an output signal from said output section;
a low pass filter that produces a filtered signal from said sampled signal;
an analog to digital converter for digitizing said filtered signal, producing a digitized signal;
a field memory that stores said digitized signal;
a control circuit that synchronizes an other digitized signal provided by said analog to digital converter with a stored digitized signal stored in said field memory;
a subtractor for comparing said stored digitized signal with said other digital signal, producing a difference signal;
a signal processor that produces a processed signal from said difference signal; and
a digital to analog converter for converting said difference signal and outputting an analog difference signal.

14. The CCD solid state imaging device of claim 13, further comprising a second field memory for storing a second digitized signal.

15. A CCD solid state imaging device comprising:
an imaging section having light receiving portions arranged in a matrix manner, and vertical transfer registers arranged to corresponding columns of said light receiving portions;
a first storage section having vertical transfer registers, each of which correspond to one of said imaging section vertical transfer registers;
a second storage section having vertical transfer registers, each of which correspond to one of said first storage section vertical transfer registers;
a horizontal transfer register adjacent to said second storage section;
a smear drain region located on a side of said horizontal transfer register opposite said adjacent second storage section;
an output section connected to said horizontal transfer register;
a sample and hold circuit for sampling an output from said output section, producing a sampled signal;
a low pass filter that produces a filtered signal from said sampled signal;
an analog to digital converter that produces a digitized signal from said filtered signal;
a field memory that stores said digitized signal;
a changeover switch that combines said stored digitized signal with an other digitized signal;

a signal processor that produces a processed signal from said combined signal; and a digital to analog converter that converts said processed signal to an analog signal and outputs said analog signal.

16. A method for driving a CCD solid state imaging device comprising an imaging section having a light receiving portion and a vertical transfer register, a first storage section having a vertical transfer register, a second storage section having a vertical transfer register, a horizontal transfer register, and an output section, said method comprising the steps of:
generating a first smear component charge in said imaging section vertical transfer register;
transferring said first smear component charge to said first storage section vertical transfer register;
generating a second smear component charge in said imaging section vertical transfer register during said first smear component charge transferring step;
transferring said first smear component charge to said second storage section vertical transfer register;
transferring said second smear component charge to said first storage section vertical transfer register;
generating an image signal in said light receiving section;
reading out said image signal from said light receiving section to said imaging section vertical transfer register;
transferring said image signal with a second smear component charge to said first storage section vertical transfer register, said second smear component charge being generated during said second smear component charge transferring step; and
transferring said second smear component charge to said second storage section vertical transfer register.

* * * * *